(12) United States Patent
Hayashi et al.

(10) Patent No.: US 7,592,576 B1
(45) Date of Patent: Sep. 22, 2009

(54) OPTICAL SENSOR ARRAY, SENSING METHOD AND CIRCUIT THEREFORE, AND DEVICE AND APPARATUS THEREBY

(75) Inventors: Yutaka Hayashi, Ibaraki (JP); Yasushi Nagamune, Ibaraki (JP); Toshitaka Ohta, Ibaraki (JP)

(73) Assignee: National Instute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 11/772,475

(22) Filed: Jul. 2, 2007

(51) Int. Cl.
*H01L 27/00* (2006.01)
(52) U.S. Cl. .................................. 250/208.1
(58) Field of Classification Search ............... 250/208.1
See application file for complete search history.

(56) References Cited

U.S. PATENT DOCUMENTS 6,885,023 B2 * 4/2005 Shields et al. ................. 257/21

FOREIGN PATENT DOCUMENTS

JP 60-198959 A 10/1985

OTHER PUBLICATIONS

Brugler, J. S. et al., "Integrated Electronics for a Reading Aid for the Blind", IEEE Journal of Solid-State Circuits, Dec. 1969, pp. 304-312, vol. SC-4, No. 6.

Weimer, P. K. et al., "Phototransistor Arrays of Simplified Design", IEEE Journal of Solid-State Circuits, Jun. 1971, pp. 135-136.

* cited by examiner

*Primary Examiner*—Seung C Sohn
(74) *Attorney, Agent, or Firm*—Westerman, Hattori, Daniels & Adrian, LLP.

(57) ABSTRACT

The present invention is made to realize a two dimensional optical sensor array having improved performance, for instance, at least one of improved response time, improved intermixing problem, improved dynamic range, improved ability to sense a lower illuminance optical image and improved signal to noise ratio. For these purposes, an optical sensor array with a novel sensing method is proposed. For sensing each of the optical sensor in the array, one of a selected group of plurality of interconnecting means is selected and is driven from a first electrical potential to a second electrical potential while rest of the selected group of plurality of interconnecting means are kept to the first electrical potential, then, photo-electrical current from optical sensors connected to the selected one of the selected group of plurality of interconnecting means is sequentially sensed at around the second electrical potential through the selected one of the selected group of plurality of interconnecting means, by sequentially driving each one of unselected group of plurality of interconnecting means from a third electrical potential to a fourth electrical potential and then from the fourth electrical potential to the third electrical potential.

90 Claims, 14 Drawing Sheets

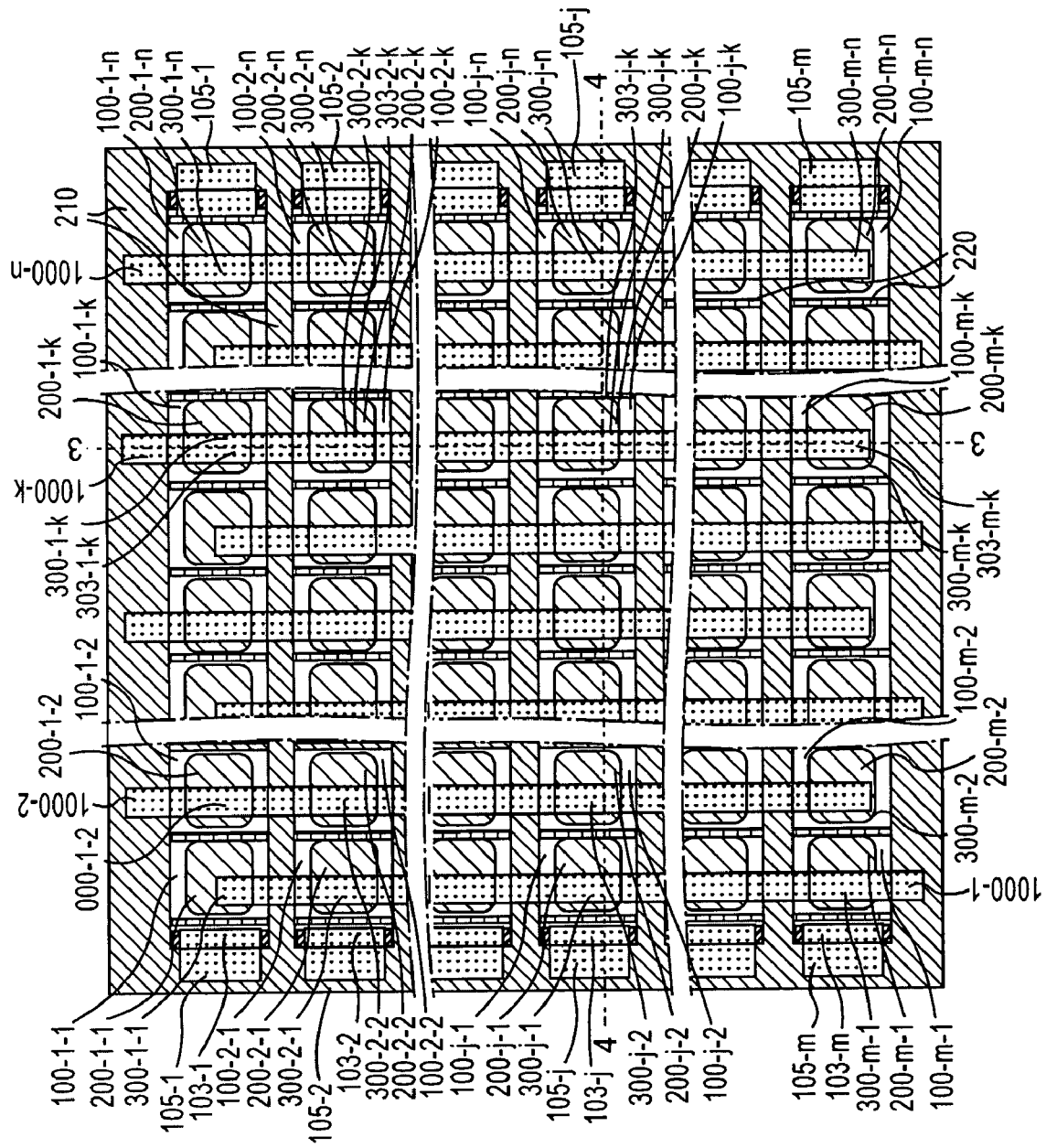
Fig.6-a

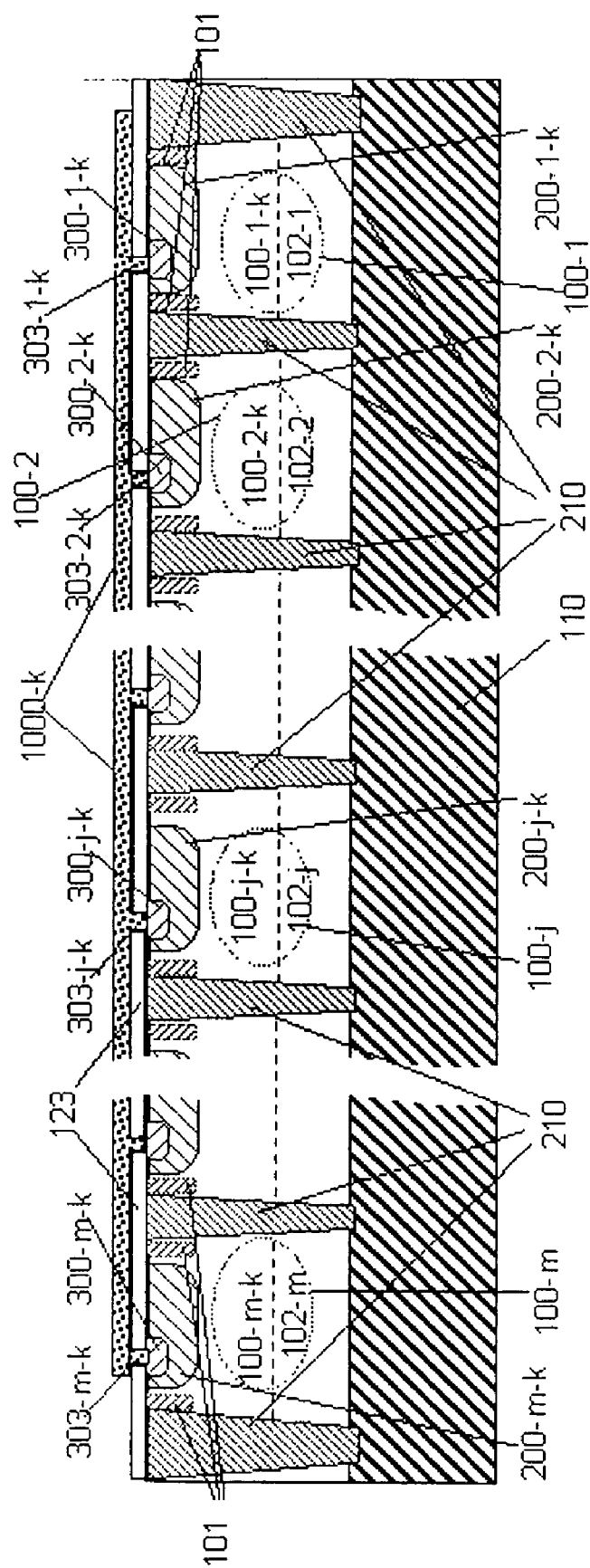
Fig. 6-b

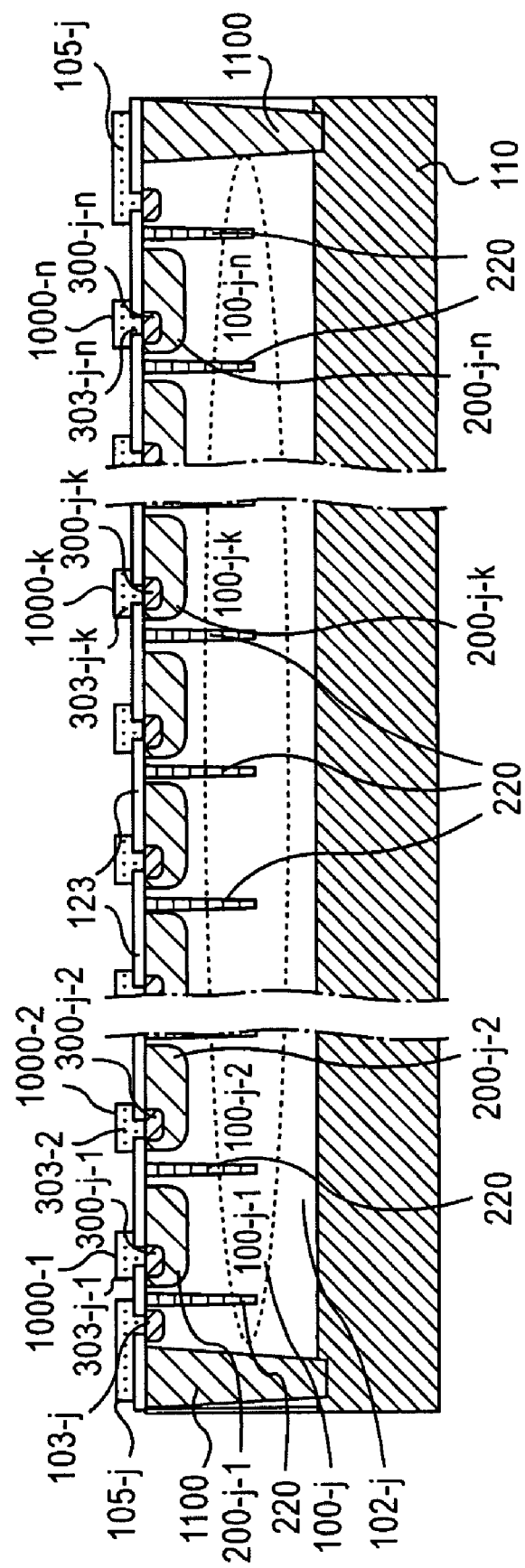
Fig.6-c

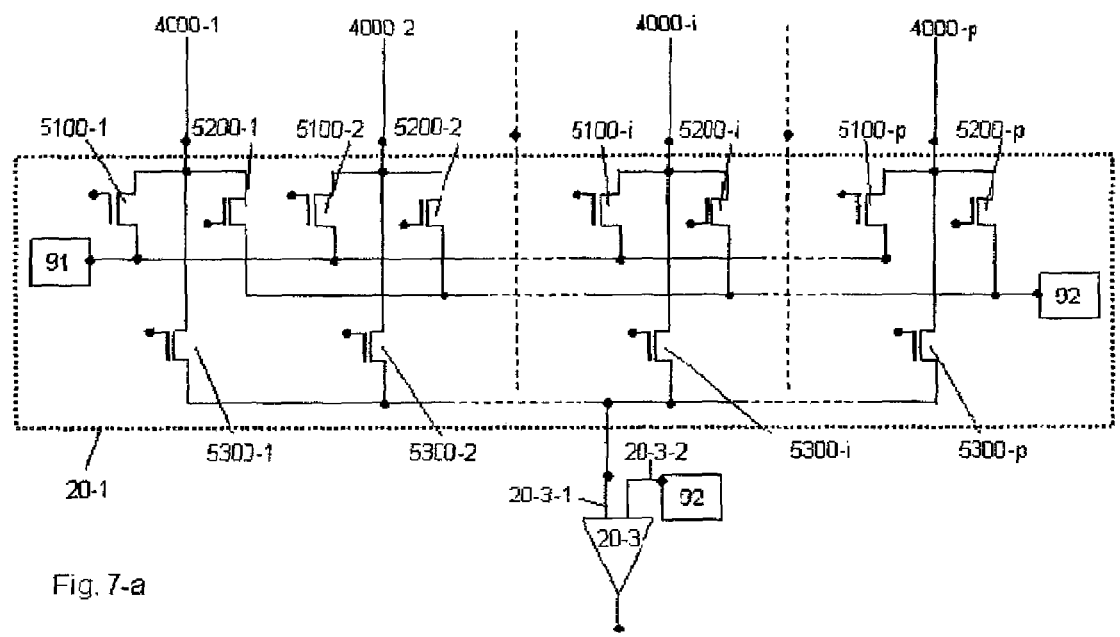
Fig. 7-a
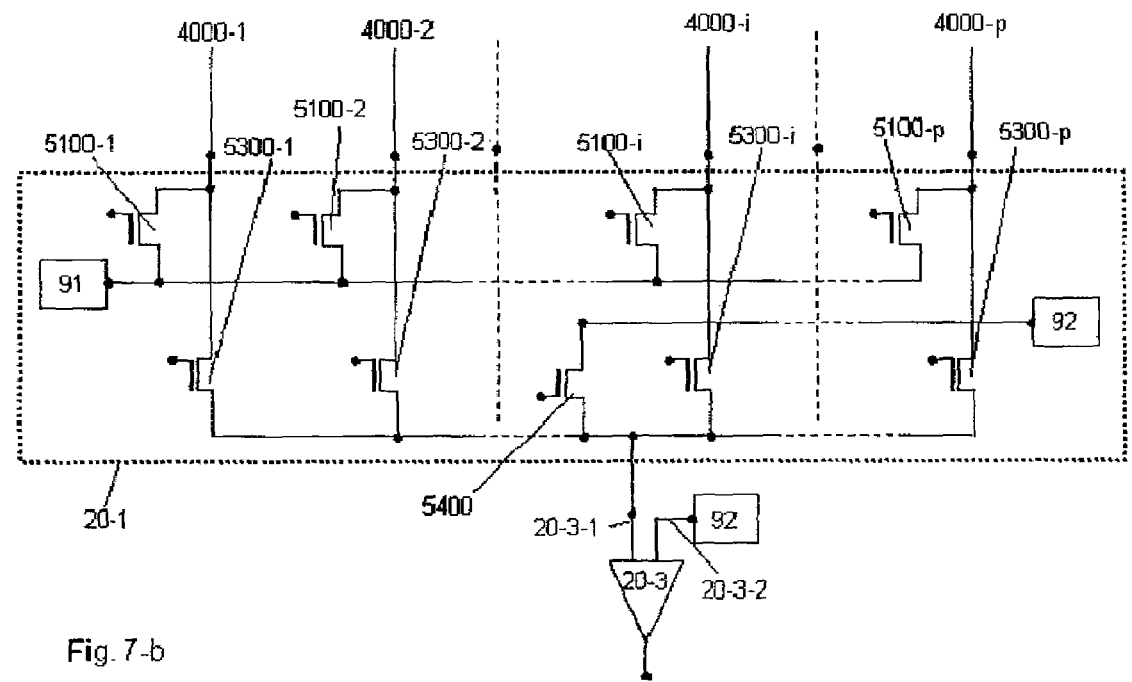
Fig. 7-b

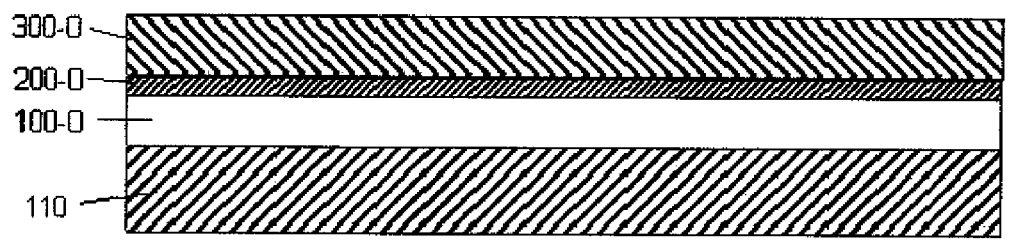
Fig. 11-a
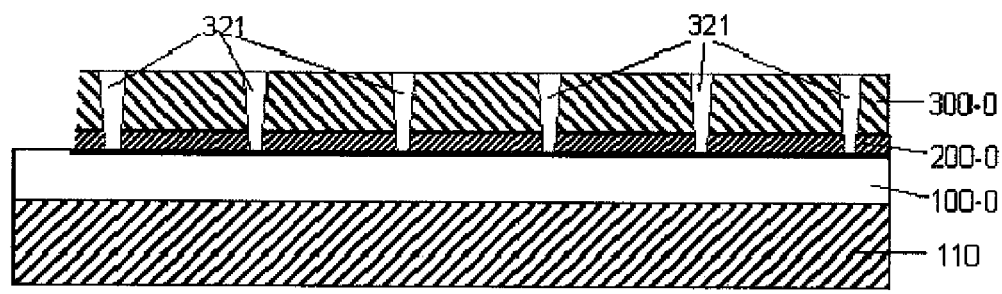
Fig. 11-b
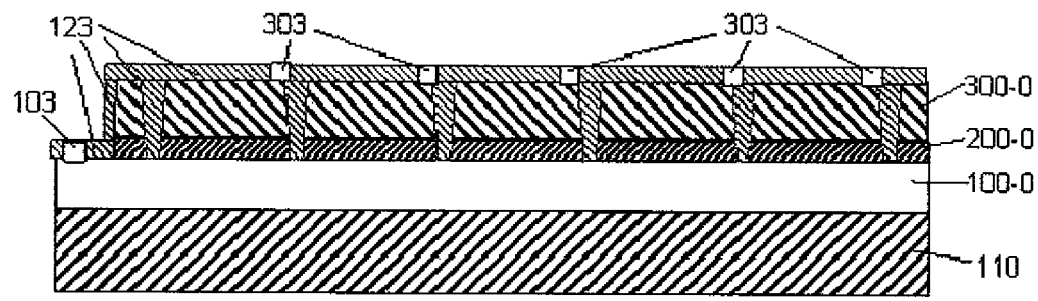
Fig. 11-c
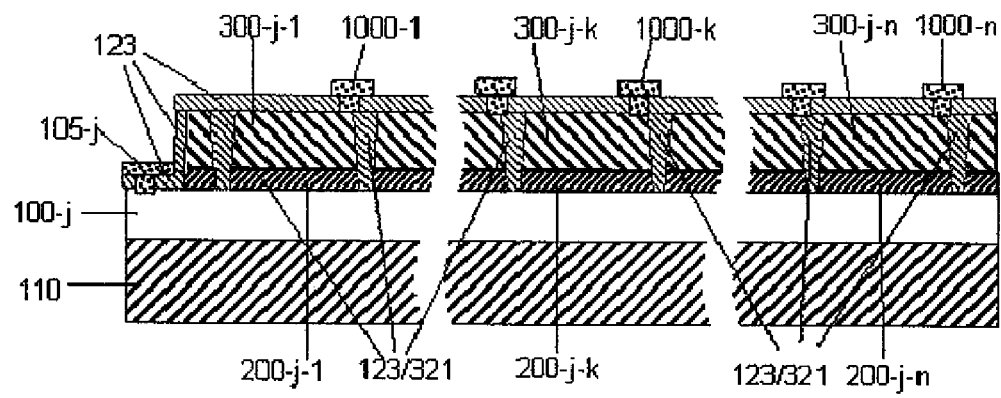
Fig. 11-d

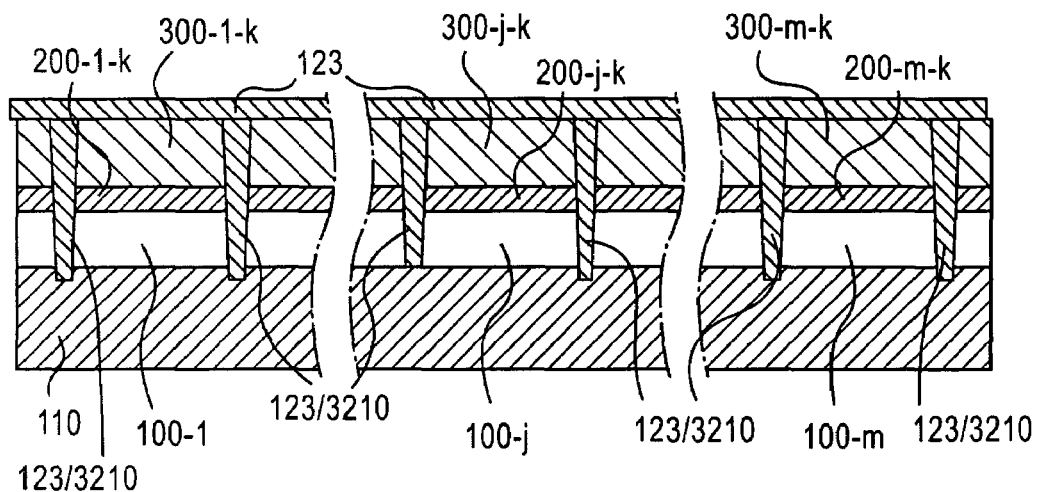
Fig.11-e
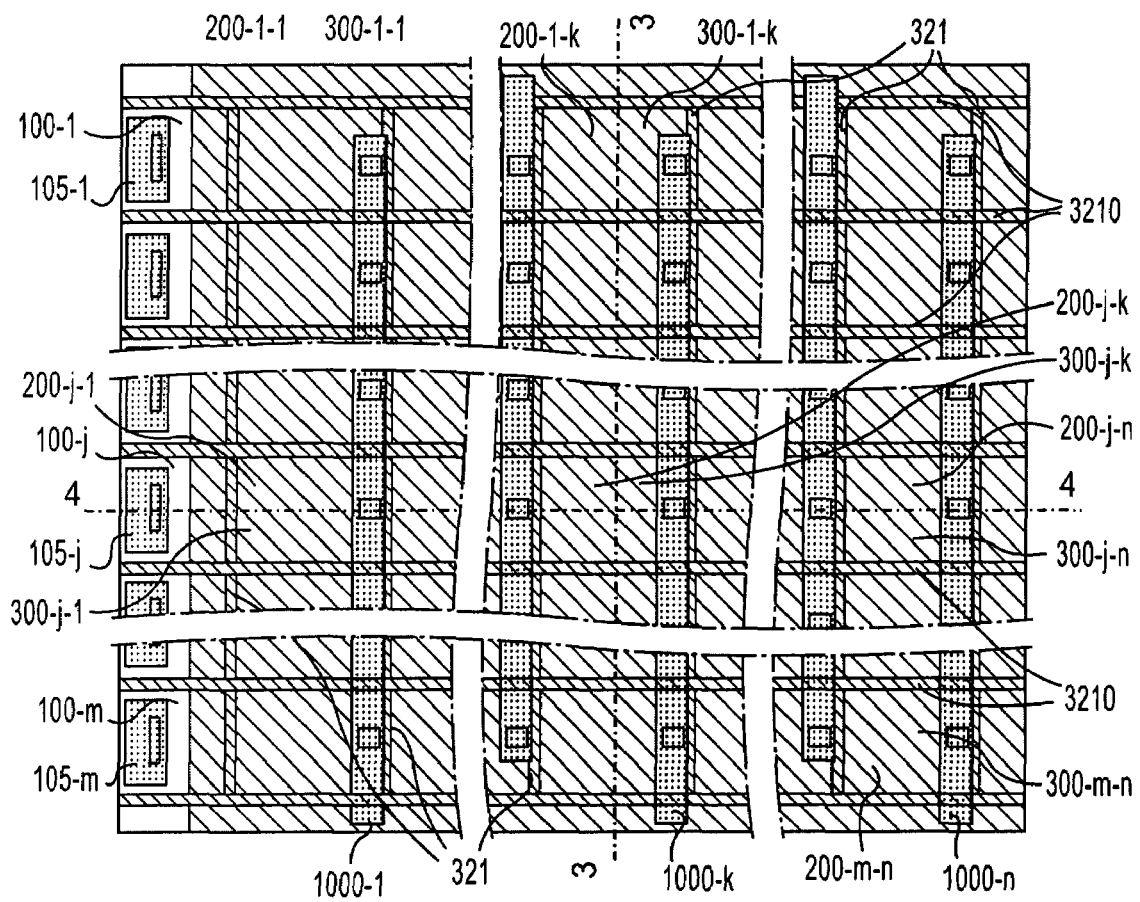
Fig.11-f

OPTICAL SENSOR ARRAY, SENSING METHOD AND CIRCUIT THEREFORE, AND DEVICE AND APPARATUS THEREBY

BACKGROUND OF THE INVENTION

1. Field of the Invention

Present invention relates to an optical sensor array which converts an optical image to electrical information including electrical current or voltage or digital data and specifically relates to an optical sensor array with improved performance. This invention further relates to a driving or sensing method and circuit for it applicable to the optical sensor array of the present invention and further relates to an optical array device by the optical array and it's periphery circuits and to an optical imaging apparatus using the optical array device and an optical imaging means.

2. Description of the Related Art

In a conventional two dimensional array of photo-transistors as shown in FIG. 1 (FIG. 5 of reference 1), emitters of the photo-transistors are connected to a word line and collectors of the photo-transistors are connected to a column line, and a word line is driven to select photo-transistors and signal from the selected photo-transistor (a sensor element) is read as a voltage change across a load resistor connected to each column line. In this optical sensor array, signal delay due to collector time constants is remarkable. The collector time constants comprise product of the load resistance and collector-base capacitance with Miller effect and product of the load resistance and collector-substrate and collector-isolation region capacitance. The effect of the collector-base capacitance is multiplied by a voltage amplification factor of the photo-transistor and this phenomenon is well known as Miller effect. In addition, leakage current at collector-substrate and collector-isolation region junction is added to collector-base leakage current and this effectively increases dark current of the photo-transistor.

Furthermore, collectors of photo-transistors commonly connected to a column experience common out put voltage swings at the load resistor attached to the column. This intermixes a stored electrical datum in each photo-transistor and as a result, reduces dynamic range of the array or contrast of a read-out electrical image. Furthermore, a lower illuminance optical image results a smaller current output from the photo-transistor and a higher resistance value for the load resistor is required for a reasonable voltage output. Then, the time response of the output voltage becomes slower and switching noise for selecting each photo-transistor superposes on the out put signal.

Thus, lower the illuminance of the optical image becomes, more difficult the capture of the optical image within a reasonable time and with reasonable noise becomes.

Reference 1: J. S. Brugler, et al., "Integrated Electronics for a Reading Aid for the Blind", IEEE Journal of Solid-State Circuits, Vol. SC-4, No. 6, p. 304-312, December, 1969.

On the other hand, a one dimensional photo-transistor array as shown in FIG. 2 (FIG. 5 of reference 2) is disclosed. Different from the above reference 1, a collector drive and emitter sense method is adopted. Thus the delay by the above stated collector capacitance was avoided but any selection method of two dimensional array for a higher response or a smaller switching noise is not taught. Furthermore, collectors are left as electrically floating when they are not selected. Even if a two dimensional array were laid out from plurality of the one dimensional photo-transistor arrays by connecting one of the collectors of neighboring one dimensional arrays of the reference 2 each other, the connected collectors are left as electrically floating when they are not selected and electrical charge stored in the collector-base junction which is a function of detected light strength will be intermixed through the connection among the collector-connected photo-transistors. Thus, a two dimensional optical image with a high dynamic range will not be obtained. In the reference 2, any sensing method is not disclosed for a two dimensional array and if a load resistor like the reference 1 is connected between a reference potential and a line with which the emitters are connected, reading a darker optical image with reasonable voltage output will result adoption of a higher resistance value and then a slower response and worse signal to noise ratio.

Reference 2: Japanese Patent Disclosure Shou 60-198959, "Image Sensor"

SUMMARY OF THE INVENTION

To solve the above issues and to realize following object, the following principles and solutions are provided in the present invention. The object of the present invention is to improve the response time (sensing speed) or the intermixing problem or ability to sense a lower illuminance optical image (higher sensitivity) or signal to noise ratio in a two dimensional optical sensor array. Another object of the present invention is to realize a two dimensional optical sensor array having improved performance, for instance, at least one of improved response time, improved intermixing problem, improved dynamic range, improved ability to sense a lower illuminance optical image and improved signal to noise ratio. Further another object of the present invention is to provide an improved optical sensor array device by the optical sensor array and it's periphery circuits and to an improved optical imaging apparatus using the optical sensor array device and an optical imaging means.

To realize one of the above objects, as one of present solutions, an optical sensor array with a sensing method is provided as follows:

an optical sensor array comprising a first group of plurality of interconnecting means, second group of plurality of interconnecting means and optical sensors; said first group of plurality of interconnecting means and said second group of plurality of interconnecting means being insulated each other and intersecting each other; each one of the optical sensors being disposed in a first direction and in a second direction and being connected to one of the first group of plurality of interconnecting means and to one of the second group of plurality of interconnecting means; an optical sensor being selected from the optical sensors at a cross-point of selected one of the first group of plurality of interconnecting means and selected one of the second group of plurality of interconnecting means, wherein;

one group of plurality of interconnecting means are selected out of the first group of plurality of interconnecting means and the second group of plurality of interconnection means, and one of the selected group of plurality of interconnecting means is further selected and is driven from a first electrical potential to a second electrical potential while rest of the selected group of plurality of interconnecting means are kept to the first electrical potential;

photo-electrical current from optical sensors connected to the selected one of the selected group of plurality of interconnecting means is sequentially sensed at around the second electrical potential through the selected one of the selected group of plurality of interconnecting means, by sequentially driving each one of unselected group of plurality of interconnecting means from a third electrical potential to a fourth electrical potential and then from the fourth electrical potential to the third electrical potential while rest of the unselected group of plurality of interconnecting means are kept to the third electrical potential.

The term "photo-electrical current" is used in the present invention as electrical current reflecting intensity of light illuminated on the optical sensor. The photo-electrical current can be usual photo-current generated in the optical sensor, electrical discharge current obtained by discharging electric charge accumulated in the optical sensor by integrating the photo-current during a period of a time or amplified electrical current of the electrical discharge current or photo-current. A combination of the fourth electrical potential supplied to the optical sensor through the one of the unselected group of plurality of interconnecting means and the second electrical potential supplied to the optical sensor through the selected one of the selected group of plurality of interconnecting means makes the photo-electrical current from the optical sensor available. A combination of the third electrical potential supplied to the optical sensor through the one of the unselected group of plurality of interconnecting means and the first electrical potential supplied to the optical sensor through one of the selected group of plurality of interconnecting means cuts the photo-electrical current from the optical sensor except a leakage current.

A combination of the fourth electrical potential supplied to the optical sensor through the one of the unselected group of plurality of interconnecting means and the first electrical potential supplied to the optical sensor through one of the selected group of plurality of interconnecting means allows a leakage current from the optical sensor or a part not a whole of the photo-electrical current from the optical sensor.

Relative polarities among and differences in value among the first, second, third and fourth electrical potentials depend on a type or a structure of the optical sensor. Embodiments of them are described later.

As the optical sensor for the optical sensor array of the present invention, a pair of back to back diodes in one of which photoelectric conversion is made, a photo-transistor, a filed effect transistor with photo-electric conversion effect and with a selection element such as a diode or an additional field effect transistor, a photo-conductor with a selection element, newly proposed sensors described below and so on can be used.

To realize one of the above objects, as the other one of present solutions, two dimensional optical sensor arrays with high gain optical sensors which will be described later is provided for reduced time response and improved signal to noise ratio even with a low illuminance image. And this high gain optical sensor as an element of a two dimensional optical sensor array is also used for the realization of a high dynamic range.

To realize one of the above objects, as the other one of present solutions, a sensing method or driving method characterized below is provided as follows:

In an optical sensor array comprising optical sensors, a first group of plurality of interconnecting means and second group of plurality of interconnecting means;

said first group of plurality of interconnecting means and said second group of plurality of interconnecting means being insulated each other and intersecting each other;

an optical sensor being selected from the optical sensors by a cross-point of selected one of the first group of plurality of interconnecting means and selected one of the second group of plurality of interconnecting means;

selecting one group of plurality of interconnecting means out of the first group of plurality of interconnecting means and the second group of plurality of interconnection means and;

further selecting one interconnecting means out of the selected group of plurality of interconnecting means;

driving the selected one of the selected group of interconnecting means from a first electrical potential to a second electrical potential while rest of the selected group of plurality of interconnecting means are kept to the first electrical potential;

sequentially sensing photo-electrical current from optical sensors connected to the selected one of the selected group of plurality of interconnecting means at around the second electrical potential through the selected one of the selected group of plurality of interconnecting means by sequentially driving each one of unselected group of plurality of interconnecting means from a third electrical potential to a fourth electrical potential and then from the fourth electrical potential to the third electrical potential while rest of the unselected group of plurality of interconnecting means are kept to the third electrical potential.

Relations among the first, second, third and fourth electrical potentials are characterized as before.

In the present driving or sensing method, unselected one of the selected group of plurality of interconnecting means and unselected group of plurality of interconnecting means are kept at each electrical potential and are not made floating and the photo-electrical current from the selected optical sensor is sensed keeping the electrical potential of the selected one of the selected group of plurality of interconnecting means at around the second electrical potential without a big change in the voltage. The big change in the voltage of the column was one of the issues in the prior arts.

The above driving or sensing method is materialized by a first driving means as follows:

a first driving means driving one of the selected group of plurality of interconnecting means from a first electrical potential to a second electrical potential and from the second electrical potential to the first electrical potential while keeping rest of the selected group of plurality of interconnecting means to the first electrical potential;

during the photo-electrical current from the selected optical sensors is sensed, the first driving means being of electrically high impedance after driving the one of the selected group of plurality of interconnecting means from the first electrical potential to the second electrical potential.

The above sensing method is further materialized by a current sensing means as follows:

a current sensing means having a non-inverting input and an inverting input;

the non-inverting input being connected to the second electrical potential and the inverting input being switched to the selected one of the selected group of the plurality of interconnecting means and photo-electrical current from the selected optical sensors being sensed during the first driving means is of electrically high impedance. An electrical potential at the inverting input is kept around the second electrical potential by feed back effect of the current sensing means when the current sensing means is made from a differential amplifier.

The above sensing method is further materialized by a second driving means as follows:

a second driving means sequentially driving each of the unselected group of plurality of interconnecting means from the third electrical potential to the fourth electrical potential and from the fourth electrical potential to the third electrical potential during the above current sensing means senses the photo-electrical current from the selected optical sensors while keeping rest of the unselected group of plurality of interconnecting means to the third electrical potential.

As one of structures to further materialize the above mentioned generic optical sensor array, the following first structure is provided in the present invention:

an optical sensor array comprising;

first semiconductor regions of a first conductivity, each having a first thickness and a first surface, being disposed in a first direction and a second direction and being spaced apart each other at least in the first direction;

the first direction and the second direction intersecting each other;

second semiconductor regions of an opposite conductivity type, each having a second thickness and a second surface, being disposed in contact with each of the first semiconductor regions and being spaced apart each other;

third semiconductor regions of the first conductivity type, each having a third thickness and a third surface, being disposed in contact with each of the second semiconductor regions;

the third semiconductor regions being disposed in the first direction and in the second direction; first group of plurality of interconnecting means insulated from each other and insulated from the first semiconductor regions and the second semiconductor regions and each interconnecting the third semiconductor regions disposed in the first direction;

second group of plurality of interconnecting means insulated from each other, insulated from the first group of plurality of interconnecting means and insulated from the second semiconductor regions and from the third semiconductor regions and each interconnecting the first semiconductor regions disposed in the second direction;

an optical sensor comprising the first, second and third semiconductor regions is selected at a cross-point of selected one of the first group of plurality of interconnecting means and selected one of the second group of plurality of interconnecting means.

A first set of relation between the first and the third electrical potentials and relation between the second and the fourth electrical potentials preferable to efficiently read photo-electrical current from the selected optical sensor is characterized as:

The fourth electrical potential with reference to the second electrical potential is of a polarity forward-biasing the second semiconductor region to the third semiconductor region. And the third electrical potential with reference to the first electrical potential is of a polarity reverse-biasing or zero-biasing the third semiconductor region to the second semiconductor region.

A second set of relation between the first and the third electrical potentials and relation between the second and the fourth electrical potentials preferable to efficiently read photo-electrical current from the selected optical sensor is characterized as:

The fourth electrical potential with reference to the second electrical potential is of a polarity forward-biasing the second semiconductor region to the first semiconductor region. And the third electrical potential with reference to the first electrical potential is of a polarity reverse-biasing or zero-biasing the first semiconductor region to the second semiconductor region.

In the present invention, wording "in contact with" is used as a generic wording including "in" or "on". For instance, "a third semiconductor region of the first conductivity type being disposed in contact with each of the second semiconductor regions" means "a third semiconductor region of the first conductivity type being disposed on or in each of the second semiconductor regions".

In the above first structure and in the other structures in the present invention, at least a part of, more specifically all of the second interconnection means can be eliminated by the following first modification:

the first semiconductor regions disposed in the second direction are in contact with each other in the second direction and interconnect themselves and work also as one of the second interconnecting means instead of the one of the second interconnecting means.

In the above first structure, in the case that incident light is converted to electric current mainly in the first semiconductor region and the second semiconductor region, the second semiconductor region and the third semiconductor region forms a selection diode or decoupling diode in the optical sensor. When the impurity concentration of the third region is larger than that of the second region in the vicinity of their junction, a bipolar transistor action with the first semiconductor region as a collector, with the second semiconductor as a base and with the third semiconductor region as an emitter is obtained.

In the above first structure, in the case that incident light is converted to electric current mainly in the third semiconductor region and the second semiconductor region, the second semiconductor region and the first semiconductor region forms a selection diode or decoupling diode in the optical sensor. When the impurity concentration of the first region is larger than that of the second region in the vicinity of their junction, a bipolar transistor action with the third semiconductor region as a collector, with the second semiconductor as a base and with the first semiconductor region as an emitter is obtained. Details of an example of this case will be described in "embodiment 11".

The structures described below as high gain optical sensors can be also used as the structures to further materialize the above mentioned generic optical sensor array.

To obtain a high gain optical sensor in the first structure, ratio of an impurity concentration of the third semiconductor region to an impurity concentration of the second semiconductor region in the vicinity of their junction is made more than 1000. However, it is difficult to realize this high ratio by a usual technology uniformly over the all optical sensors in an array and more difficult over a semiconductor wafer.

To realize one of the above objects, as one of present solutions by solving this difficulty and obtaining a further high gain or high dynamic range, the following second structure is provided: an optical sensor array comprising:

first semiconductor regions of a first conductivity, each having a first thickness and a first surface, being disposed in a first direction and a second direction and being spaced apart each other at least in the first direction;

the first direction and the second direction intersecting each other;

second semiconductor regions of an opposite conductivity type each having a second thickness and a second surface, being disposed in contact with each of the first semiconductor regions and being spaced apart each other;

third semiconductor regions of the first conductivity type each having a third thickness and a third surface and each being disposed in contact with each of the second semiconductor regions; fourth semiconductor regions of the opposite conductivity type each disposed in contact with each of the first semiconductor regions, each disposed adjacent to but apart from each of the second semiconductor regions and interconnected to the third semiconductor region being in contact with the each of the second semiconductor regions;

fifth semiconductor regions of the first conductivity type each disposed in contact with each of the fourth semiconductor regions;

the fourth and the fifth semiconductor regions being disposed in the first direction and in the second direction;

first group of plurality of interconnecting means insulated from each other and insulated from the first semiconductor regions, the second semiconductor regions, the third semiconductor regions and the fourth semiconductor regions and each interconnecting instead of the third semiconductor regions the fifth semiconductor regions disposed in the first direction;

second group of plurality of interconnecting means insulated from each other, insulated from the first group of plurality of interconnection means and insulated from the second semiconductor regions, the third semiconductor regions, the fourth semiconductor regions and the fifth semiconductor regions and each interconnecting the first semiconductor regions disposed in the second direction;

an optical sensor comprising the first, second, third, fourth and fifth semiconductor regions is selected at a cross-point of one of the first group of plurality of interconnecting means and one of the second group of plurality of interconnecting means.

By adopting the second structure, an optical sensor array with higher sensitivity and with higher dynamic range than those of the first structure is obtained. In addition to a first selection diode or decoupling diode formed by the second semiconductor region and the third semiconductor region, a second selection or decoupling diode formed by the fourth semiconductor region and the fifth semiconductor region is serially connected in the optical sensor, and thus dynamic range limited by the breakdown voltage of the first selection or decoupling diode can be doubled. When the impurity concentration of the fifth region is larger than that of the fourth region in the vicinity of their junction, a bipolar transistor action with the first semiconductor region as a collector, with the fourth semiconductor as a base and with the fifth semiconductor region as an emitter is obtained and photo-electrical current from the optical sensor is further amplified and the amplified photo-electrical current is supplied to the first group of interconnecting means.

To eliminate partly or completely the second group of plurality of interconnection means, the second structure can be modified as follows:

the first semiconductor regions disposed in the second direction are in contact with each other in the second direction and interconnect themselves as one of the second interconnecting means instead of the one of the second interconnecting means.

To realize one of the above objects, as one of present solutions by further high gain or high dynamic range, the following third structure is provided:

an optical sensor array according to the second structure, further comprising:

sixth semiconductor regions of the opposite conductivity type each disposed in contact with each of the first semiconductor regions, each disposed adjacent to but apart from each of the second and the fourth semiconductor regions and interconnected to the fifth semiconductor region being in contact with the each of the fourth semiconductor regions;

seventh semiconductor regions of the first conductivity type each disposed in contact with each of the sixth semiconductor regions;

the sixth semiconductor regions and the seventh semiconductor regions being disposed in the first direction and in the second direction;

the first group of plurality of interconnecting means insulated from each other and insulated from the first, the second, the third, the fourth, the fifth and the sixth semiconductor regions and each interconnecting instead of the fifth semiconductor regions the seventh semiconductor regions in the first direction;

an optical sensor comprising the first, second, third, fourth, fifth, sixth and seventh semiconductor regions is selected at a cross-point of one of the first group of plurality of interconnecting means and one of the second group of plurality of interconnecting means.

By adopting the third structure, an optical sensor array with higher sensitivity and with higher dynamic range than those of the second structure is obtained. In addition to the first selection diode or decoupling diode formed by the second semiconductor region and the third semiconductor region and in addition to the second selection or decoupling diode formed by the fourth semiconductor region and the fifth region, a third selection or decoupling diode formed by the sixth semiconductor region and the seventh semiconductor region is serially connected in the optical sensor, and thus dynamic range limited by the breakdown voltage of the first selection or decoupling diode can be tripled to the first structure. When the impurity concentration of the seventh semiconductor region in the vicinity of their junction is larger than that of the sixth semiconductor region, a bipolar transistor action with the first semiconductor region as a collector, with the sixth semiconductor as a base and with the seventh semiconductor region as an emitter is obtained and photo-electrical current from the optical sensor is further amplified and the amplified photo-electrical current is supplied to the first group of interconnecting means.

To realize one of the above objects, as one of present solutions by further high gain or high dynamic range, the following fourth structure is provided:

an optical sensor array according to the third structure, further comprising:

eighth semiconductor regions of the opposite conductivity type each disposed in contact with each of the first semiconductor regions, each disposed adjacent to but apart from each of the second, fourth and sixth semiconductor regions and interconnected to each of the seventh semiconductor regions being in contact with each of the sixth semiconductor regions;

a ninth semiconductor regions of the first conductivity type each disposed in contact with each of the eighth semiconductor regions;

the eighth semiconductor regions and the ninth semiconductor regions being disposed in the first direction and in the second direction;

the first group of plurality of interconnecting means insulated from each other and insulated from the first, the second, the third, the fourth, the fifth, the sixth, the seventh and eighth semiconductor regions and each interconnecting, instead of the seventh semiconductor regions, each of ninth semiconductor regions in the first direction.

By adopting the fourth structure, an optical sensor array with higher sensitivity and with higher dynamic range than those of the third structure is obtained. In addition to the first selection diode or decoupling diode formed by the second semiconductor region and the third semiconductor region, the second selection or decoupling diode formed by the fourth semiconductor region and the fifth semiconductor region and the third selection or decoupling diode formed by the sixth semiconductor region and the seventh semiconductor region, a fourth selection or decoupling diode formed by the eighth semiconductor region and the ninth semiconductor region is serially connected for the optical sensor element, and thus dynamic range limited by the breakdown voltage of the first selection or decoupling diode can be quadrupled to the first structure. When the impurity concentration of the ninth region is larger than that of the eighth region in the vicinity of their junction, a bipolar transistor action with the first semiconductor region as a collector, with the eighth semiconductor as a base and with the ninth semiconductor region as an emitter is obtained and photo-electrical current from the optical sensor element is further amplified and the amplified photo-electrical current is supplied to the first group of interconnecting means.

By further general expression, the third, fourth, - - - , (n/2)th structures can be described as follows:

An optical sensor array according to the second structure, further comprising:

one pair or plurality pairs of semiconductor regions;

the one pair or plurality pairs of semiconductor regions comprising;

sixth to nth semiconductor region of the opposite conductivity type disposed apart from each of the second and the fourth semiconductor regions and in contact with each the first semiconductor region, and seventh to (n+1)th semiconductor region of the first conductivity type in contact with said each said sixth to nth semiconductor region and;

the "n" denoting an even integer number beginning from six and number of the pair being one when n equals 6, two when n equals eight, three when n equals ten and four when n equals twelve;

the third semiconductor region being interconnected instead of the fourth region to the sixth semiconductor region;

the fourth semiconductor region being interconnected instead of the third semiconductor region to the (n+1)th semiconductor region;

an odd numbered semiconductor region of a pair of the plurality pairs of semiconductor regions except said (n+1)th semiconductor region being each interconnected to an even numbered semiconductor region of another pair of the plurality pairs of semiconductor regions.

the "n" denoting an even integer number beginning from six and number of the pair being one when n equals 6, two when n equals eight, three when n equals ten and four when n equals twelve;

the third semiconductor region being interconnected instead of the fourth region to the sixth semiconductor region;

the fourth semiconductor region being interconnected instead of the third semiconductor region to the (n+1)th semiconductor region;

an odd numbered semiconductor region of a pair of the plurality pairs of semiconductor regions being each interconnected to an even numbered semiconductor region of another pair of the plurality pairs of semiconductor regions.

In the above mentioned optical sensor arrays, the following modification can be made for using the first semiconductor region as at least a part of the second group of plurality of interconnecting means:

the first semiconductor regions disposed in the second direction are in contact with each other in the second direction and interconnect themselves as one of the second group of plurality of interconnecting means instead of the one of the second group of plurality of interconnecting means.

The above stated amplification factors are not necessarily uniform over the all optical sensors in one optical sensor array, if a careful and adequate process design is not made. In the present invention, non-uniformity of sensed photo-electrical current from each optical sensor in the optical sensor array can be corrected by the following:

An optical sensor array device comprising:

an optical sensor array;

a periphery circuitry driving and sensing each electrical information from each optical sensor in the optical sensor array;

a memory block memorizing each reference electrical information from the each optical sensor in the optical sensor array under a reference illumination and;

a correction circuit dividing the each electrical information by the each reference electrical information memorized in the memory and outputting each divided value;

the each divided value being used as each corrected electrical information of the optical sensors.

Thus, image information with higher fidelity can be obtained without the non-uniformity of the optical sensor array being superposed.

The above each electrical information can be each photo-electrical current itself from each optical sensor or each voltage converted from the each photo-electrical current. The above reference electrical information can be each reference photo-electrical current itself from each optical sensor, each reference voltage converted from the each reference photo-electrical current and usually memorized in the memory block as each reference digital data converted from the each reference photo-electrical current or the each reference voltage.

The division can be processed by a digital arithmetic unit as a part of the correction circuit using the each reference digital data and each digital data converted from the each photo-electrical current or the each voltage from the optical sensor under a target optical image. The reference illumination can be a uniform illumination or some patterned illumination.

Dark current compensation is also can be realized in an optical sensor array device, comprising:

an optical sensor array;

a periphery circuitry driving and sensing each electrical information from each optical sensor in the optical sensor array;

a memory block memorizing each dark electrical information from the each optical sensor in the optical sensor array without illumination and;

a correction circuit subtracting from the each electrical information the each dark electrical information memorized in the memory and outputting each subtracted value;

the each subtracted value being used as each compensated electrical information of the optical sensor array.

The above two optical sensor array devices can be combined to obtain an electrical image output both with correction to the gain non-uniformity and with compensation to the dark current.

Nonlinearity of the optical sensor can be also corrected by making the number of the reference illumination plural and making plural sets of reference digital data memorized in the memory block and making the each digital data form each optical sensor divided by a reference digital data form the each optical sensor with reference level nearest to the each digital data from the each optical sensor;

the plurality of reference illumination have each illumination level and the divided data are further multiplied by the illumination level.

When non-volatile memory elements are used for memory elements in the memory block, factory correction before shipment of the optical sensor array device is possible.

Transient current flows through the selected one of the selected group of plurality of interconnecting means when driven to the second electrical potential from the first electrical potential and it will superpose the sensed photo-electrical current from a selected optical sensor. The transient current can be canceled by applying it's electrical information to an input of a differential amplifier with the electrical information from the selected optical sensor applied to another input of the differential amplifier. The electrical information of the selected optical sensor mixed with the transient current information is obtained from the output of a first current sensing means with its input connected to the selected one of the selected group of plurality of interconnecting means. The electrical information of the transient current can be obtained from the out put of a second current sensing means with the transient current coupled to its input.

For the practical cancellation, at least one dummy interconnecting means, to which dummy optical sensors are connected and which is driven from the first electrical potential to the second electrical potential at the same time when the selected one of the selected group of plurality of interconnecting means is driven, is electrically coupled to the input of the second current sensing means. When the dummy optical sensors are shadowed from illumination by a shadowing film over it, the above arrangement is also effective for dark current cancellation.

Furthermore, there is another way to avoid an undesirable effect of the transient current. For instance, the current sense from the selected optical sensor is made with a time delay from the time when the selected one of selected group of plurality of interconnecting means is driven to the second electrical potential from the first electrical potential.

To make this transient current decay faster, the selected one of the selected group of plurality of interconnecting means should firstly be switched to a low impedance potential node with the second electrical potential and secondly be switched off from the low impedance potential node and then the current sense from the selected optical sensor is performed with the time delay by a current sense amplifier with the second potential supplied to its non-inverting input. In this time sequence, the time delay for the initiation of the current sense can be controlled by duration between driving the selected one of the selected group of plurality of interconnecting means from the first electrical potential to the second electrical potential and driving the unselected group of plurality of interconnection means from the third electrical potential to the fourth electrical potential.

In the first, second, third or fourth structures, the first semiconductor regions can be formed on a substrate.

The first semiconductor region be spaced apart each other by a twenty first semiconductor region at least in the first direction. Furthermore, a twenty second region can be disposed between two of the second semiconductor regions to prevent intermixing photo-generated carriers in neighboring pixels. The substrate can be of the opposite conductivity semiconductor. Furthermore the substrate can be of semi-insulating semiconductor or of insulating material to eliminate polarity limitation or to reduce capacitance between the first semiconductor region and the substrate. The twenty first region can be of the opposite conductivity semiconductor and furthermore, can be of semi-insulating semiconductor or of insulating material or air gap to eliminate polarity limitation or to reduce capacitance between the first semiconductor region and the twenty first region. The twenty second region can be of the opposite conductivity semiconductor and furthermore, can be of semi-insulating semiconductor or of insulating material or air gap to eliminate polarity limitation or to reduce capacitance between the first semiconductor region and the twenty second region.

BRIEF DESCRIPTION OF THE DRAWING

In the accompanying drawings;

FIG. 6 shows a first example of the first structure of the present invention. FIG. 6-*a* shows a plan view of the first example. FIG. 6-*b* shows a cross-sectional view of the first example along a intersection line 3-3 in FIG. 6-*a* and FIG. 6-*c* shows a cross-sectional view of the first example along a intersection line 4-4 in FIG. 6-*a*.

FIG. 7-*a* shows a circuit diagram of a first example of FET (field effect transistor) circuit for the first driving means.

FIG. 7-*b* shows a circuit diagram of a second example of FET (field effect transistor) circuit for the first driving means.

FIGS. 11-*a*, 11-*b* and 11-*c* show a process step for fabricating an example of a fifth structure according to the present invention and FIGS. 11-*d*, 11-*e*, 11-*f* shows cross sections and a plan view of the thus obtained fifth structure. FIG. 11-*e* shows a cross-sectional view of the fifth structure along line 3-3 on FIG. 11-*f* and FIG. 10-*d* shows a cross-sectional view of the fifth structure along line 4-4 of FIG. 11-*f*.

DETAILED DESCRIPTION OF PREFERRED EMBODIMENTS

Detailed description will be given through the following preferred embodiments and examples.

However, the present invention is not limited to the content described below.

Embodiment 1

Figure 1:
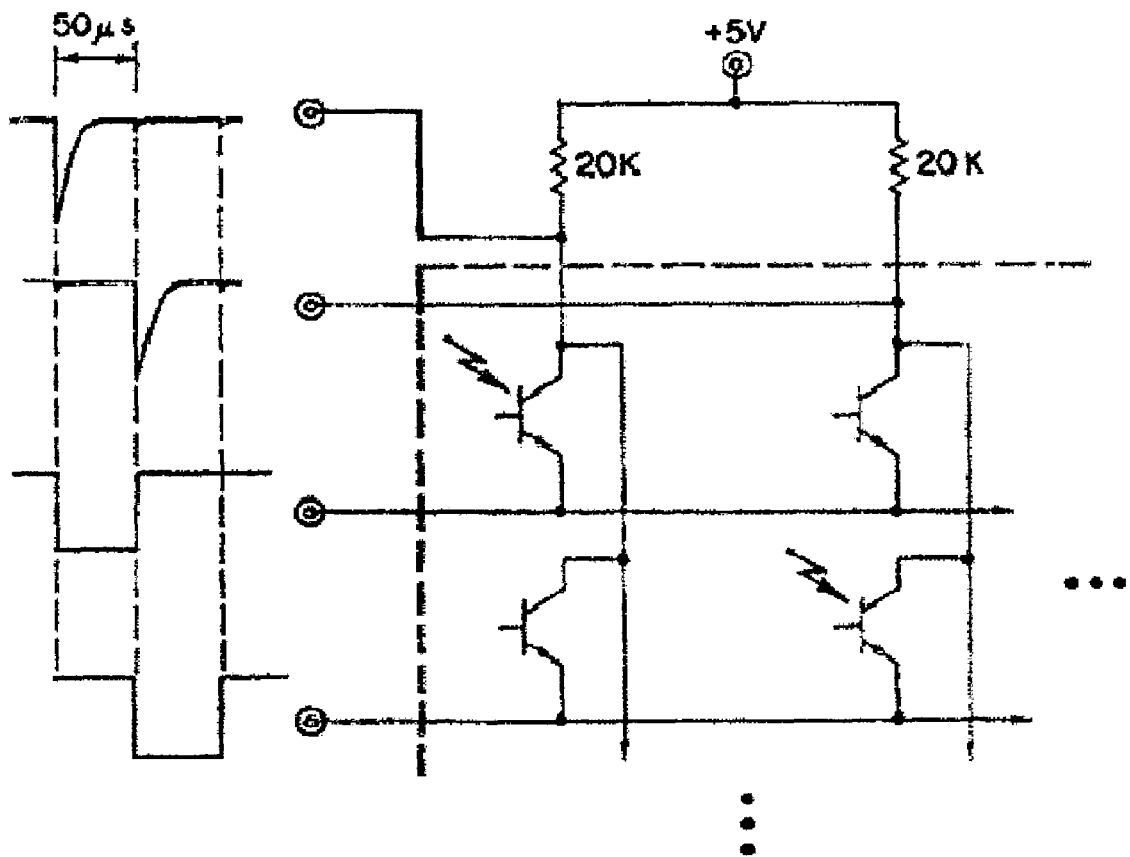
FIG. 1 shows a circuit diagram of a conventional two dimensional array of photo-transistors with a load resistor attached to a column line to which collectors of column photo-transistors are connected.
Figure 2:
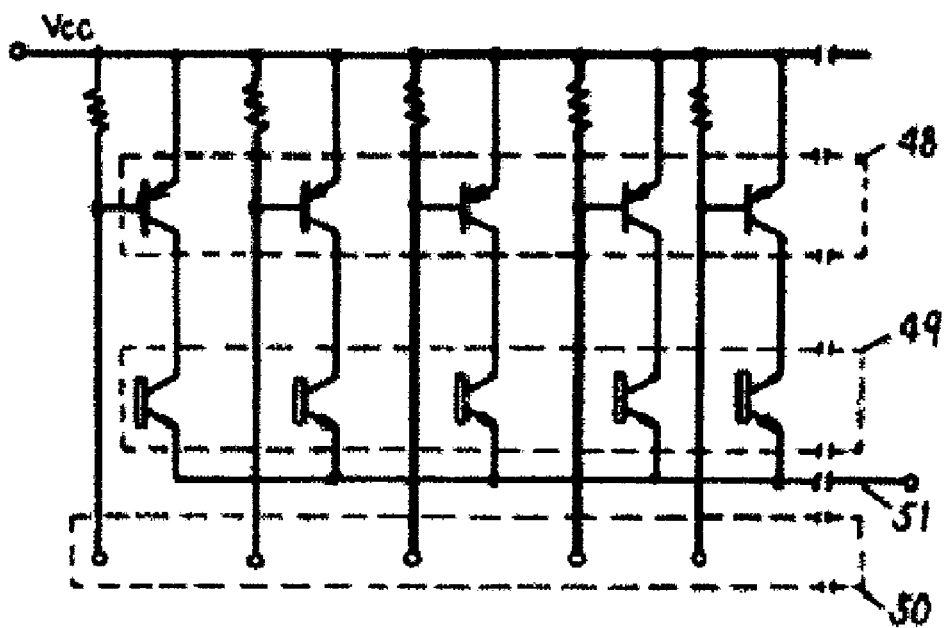
FIG. 2 shows a circuit diagram of a conventional one dimensional array of photo-transistors with a collector drive circuit. Non-selected collectors are floating.
Figure 3:
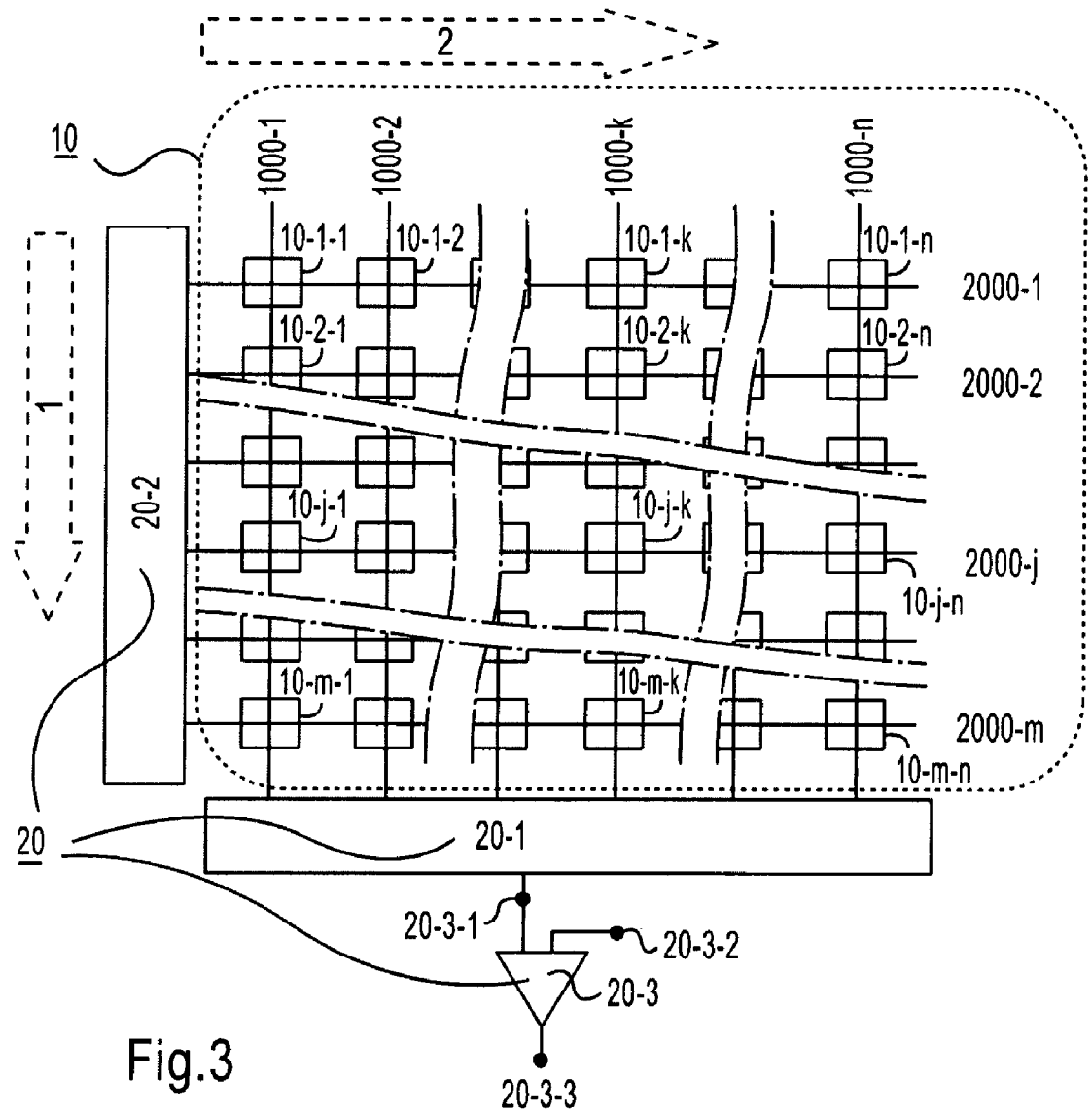
FIG. 3 shows an optical sensor array device according to the present invention.

An Optical Sensor Array Device with High Sensitivity and/or Better Signal to Noise Ratio FIG. 3 shows an optical sensor array device according to the present invention, comprising:

an optical sensor array 10; periphery circuitry 20 comprising a first driving means 20-1, a second driving means 20-2; and a current sensing means 20-3.

The optical sensor array 10 comprises optical sensors disposed in a first direction and in a second direction; a first group of plurality of interconnecting means 1000-1, 1000-2, - - -, 1000-k, - - -, 1000-n; a second group of plurality of interconnecting means 2000-1, 2000-2, - - -, 2000-j, - - -, 2000-m. Each one of the optical sensors is connected to one of the first group of plurality of interconnecting means and to one of the second group of plurality of interconnecting means; and an optical sensor 10-j-k is selected from the optical sensors at a cross-point of selected one of the first group of plurality of interconnecting means 1000-k and selected one of the second group of plurality of interconnecting means 2000-j. FIG. 3 shows a case that selected group of the plurality of interconnecting means are the first group of plurality of interconnecting means. In the figure, an arrow with numeral 1 shows the first direction to which the first group of plurality of interconnecting means extend, while an arrow with numeral 2 shows the second direction to which the second group of plurality of interconnecting means extend. The first direction and the second direction intersects each other.

Electrical information of each optical sensor in the optical sensor array is sensed according to the following sensing method.

One group (the first group, in this embodiment) of plurality of interconnecting means are selected out of the first group of plurality of interconnecting means and the second group of plurality of interconnection means, and one interconnecting means is further selected out of the selected group (the first group, in this embodiment) of plurality of interconnecting means and is driven by a first driving means 20-1 from a first electrical potential to a second electrical potential while rest of the selected group (the first group, in this embodiment) of plurality of interconnecting means are kept to the first electrical potential and then the first driving means turns to of a high impedance output state.

Photo-electrical current from optical sensors connected to the selected one of the selected group (the first group, in this embodiment) of plurality of interconnecting means is sequentially sensed by the current sensing means 20-3 at around the second electrical potential through the selected one of the selected group (the first group, in this embodiment) of plurality of interconnecting means, by sequentially driving by the second driving means each one of unselected group (the second group, in this embodiment) of plurality of interconnecting means from a third electrical potential to a fourth electrical potential and then from the fourth electrical potential to the third electrical potential while rest of the unselected group (the second group, in this embodiment) of plurality of interconnecting means are kept to the third electrical potential.

A combination of the fourth electrical potential supplied to the optical sensor through the one of the unselected group of plurality of interconnecting means and the second electrical potential supplied to the optical sensor through the selected one of the selected group of plurality of interconnecting means makes the photo-electrical current from the optical sensor available. A combination of the third electrical potential supplied to the optical sensor through the one of the unselected group of plurality of interconnecting means and the first electrical potential supplied to the optical sensor through the selected one of the selected group of plurality of interconnecting means cuts the photo-electrical current from the optical sensor except a leakage current.

Thus, each electrical information (e.g. as a voltage signal) from each optical sensor in the optical sensor array 10 under a target optical image is sequentially obtained from an output terminal 20-3-3 of the current sensing means 20-3.

At the beginning of the current sense an electrical potential of an input terminal of a current sensing means 20-3 is kept at a value near to the second electrical potential as possible.

Sensing the photo-electrical current from the optical sensor at around the second electrical potential can be realized by a current sense amplifier 20-3 with differential inputs like an inverting input 20-3-1 and a non-inverting input 20-3-2 as shown in FIG. 3. The second electrical potential is supplied to non-inverting input 20-3-2, while the inverting input 20-3-1 is switched to a selected one of the selected group of plurality of interconnecting means.

In this invention, a combination of color filter films, such as red (R), green (G) and blue (B), can be disposed over the optical sensors. When the color filters are disposed along the selected group of the plurality of interconnecting means, R, G, B information of an image on the optical sensor array can be sequentially read by sequentially driving the unselected group of interconnecting means.

Embodiment 2

Figure 4:
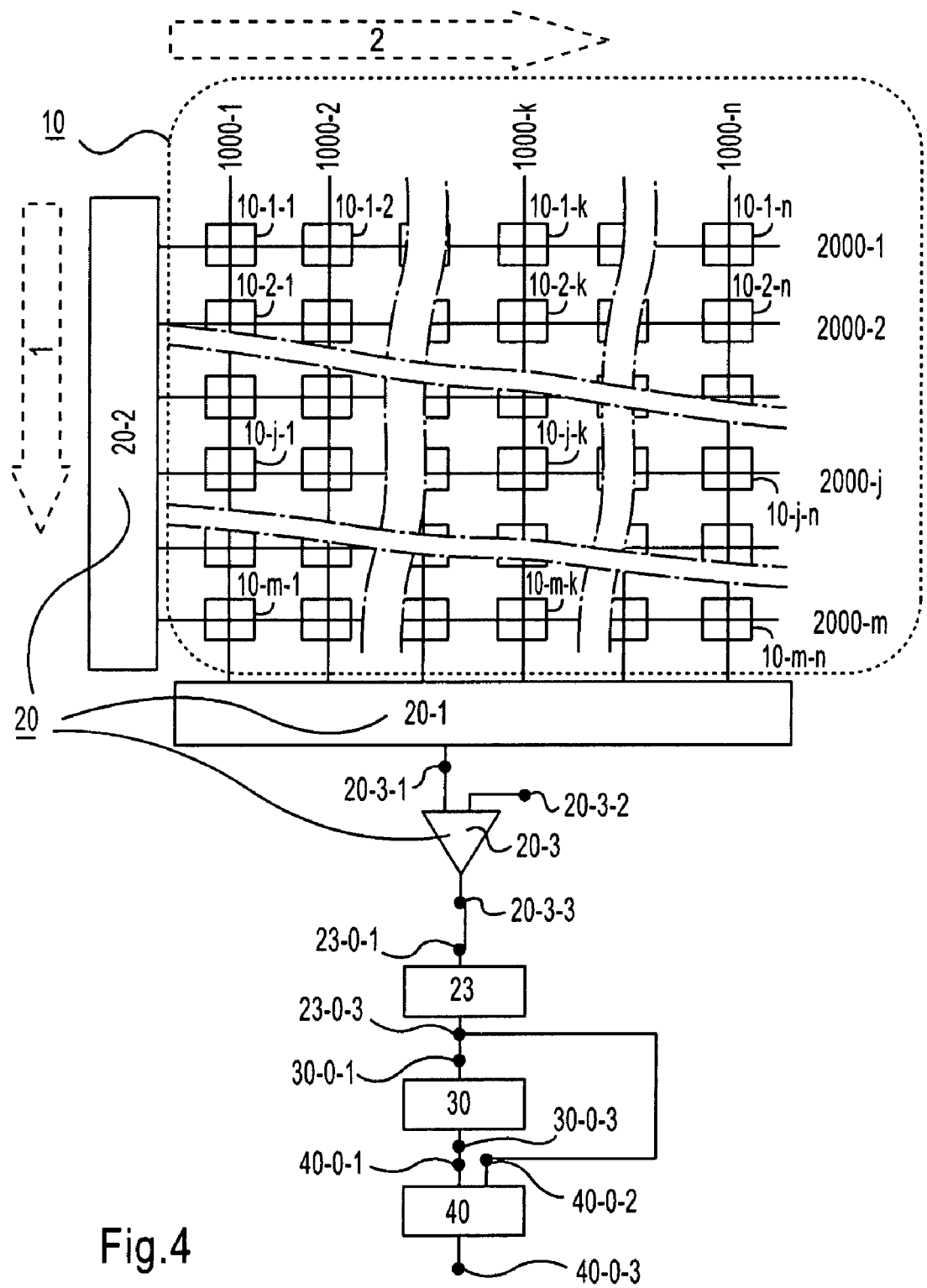
FIG. 4 shows an optical sensor array device with a memory block according to the present invention.

An Optical Sensor Array Device with High Fidelity and/or High Sensitivity and/or Better Signal to Noise Ratio For an application where high fidelity image information is required, an optical sensor array device further comprising an analog to digital converter 23; a memory block 30 and correction circuit 40 in addition to architecture shown in FIG. 3 is provided. As shown in FIG. 4, the output terminal 20-3-3 of the current sensing means is connected to an input terminal 23-0-1 of the analog to digital converter and an output terminal 23-0-3 of the analog to digital converter is connected to an input terminal 30-0-1 of the memory block and an input terminal 40-0-2 of the correction circuit an output terminal 30-0-3 of the memory block is connected to an input terminal 40-0-1 of the correction circuit. Terminal 40-0-3 is an output terminal of the correction circuit.

First, using above sensing method mentioned in the embodiment 1, each reference electrical information from each optical sensor in the optical sensor array 10 under a reference illumination is sensed. The each reference electrical information sensed is converted to each reference digital data by an analog to digital converter 23 and memorized in the memory block 30. Then, using above mentioned sensing method, each electrical information from each optical sensor in the optical sensor array 10 under a target optical image is sensed. The each electrical information sensed is converted to each digital data by the analog to digital converter and divided in the correction circuit 40 by each reference digital data stored in the memory block 30. The correction circuit outputs the each digital data divided by each reference digital data as data for high fidelity electrical image data.

Nonlinearity of the optical sensor can be also corrected by making the number of the reference illumination plural and making thus obtained plural sets of reference digital data memorized in the memory block and making the each digital data form each optical sensor under a target image divided by a reference digital data form the each optical sensor with reference level nearest to the each digital date from the each optical sensor;
the plurality of reference illumination have each illumination level and
the divided data are further multiplied by the illumination level.

For the compensation of so called "dark current" of each optical sensor using the above mentioned system, each "dark" electrical information from each optical sensor in the array 10 in a "dark" environment is sensed. The each "dark" electrical information sensed is converted to each "dark" digital data by the analog to digital converter and memorized in the memory block 30. Then, using above mentioned sensing method, each electrical information from each optical sensor in the array 10 under a target optical image is sensed. The each electrical information sensed is converted to each digital data by the analog to digital converter and subtracted in a correction circuit 40 by each "dark" digital data stored in the memory block 30. The correction circuit outputs the each digital data subtracted by each "dark" digital data as data for high sensitivity electrical image data for a low illuminance image and higher signal to noise ratio.

Memory elements in the memory block can be static memory elements or dynamic memory elements or non-volatile memory elements. When non-volatile memory elements are used for memory elements in the memory block, factory correction before shipment of the optical sensor array device is possible.

Embodiment 3

Figure 5:
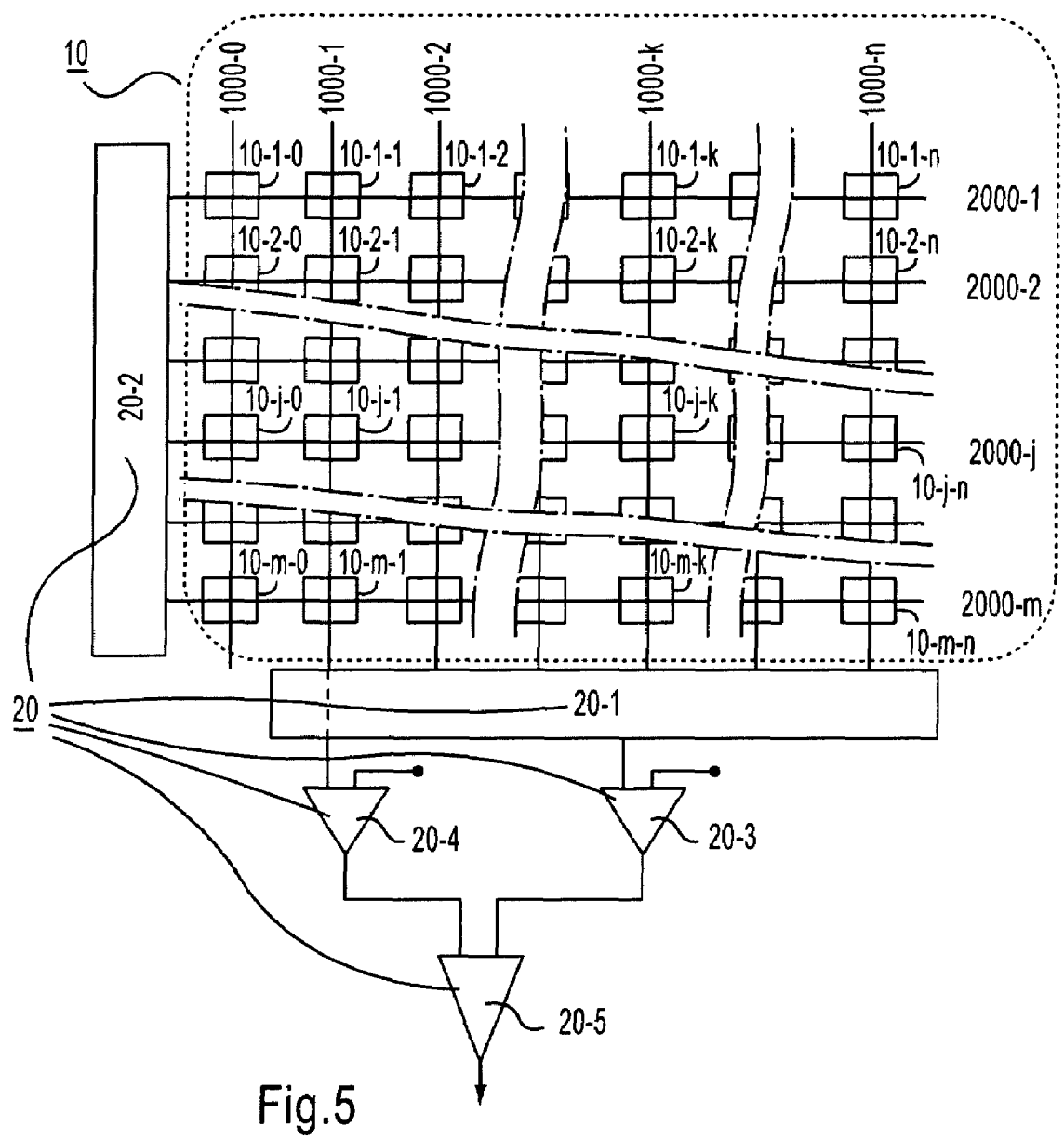
FIG. 5 shows another optical sensor array device according to the present invention.

FIG. 5 shows another optical sensor array device according to the present invention, comprising: an optical array sensor 10; periphery circuitry 20 comprising first driving means 20-1 and a second driving means 20-2; a current sensing means 20-3; a dummy current sensing means 20-4 and differential amplifier 20-5.

The optical sensor array 10 comprises a first group of plurality of interconnecting means 1000-1, 1000-2, - - - , 1000-$k$, - - - , 1000-$n$; at least one dummy interconnecting means 1000-0 to which dummy optical sensors 10-1-0, 10-2-0, - - - , 10-$j$-0, - - - , 10-$m$-0 are connected; second group of plurality of interconnecting means 2000-1, 2000-2, - - - , 2000-$j$, - - - , 2000-$m$ and an optical sensor 10-$j$-$k$ of which is selected by a cross-point of selected one of the first group of plurality of interconnecting means 1000-$k$ and selected one of the second group of plurality of interconnecting means 2000-$j$. FIG. 5 shows a case that the selected group of the plurality of interconnecting means are the first group of plurality of interconnecting means.

For an application where very low illuminance image information is not required, the dummy interconnecting means with dummy optical sensors and the dummy current sensing means and the differential amplifier are not always necessary.

Electrical information of each optical sensor in the optical sensor array is sensed according to the following sensing method.

One group (the first group, in this embodiment) of plurality of interconnecting means are selected out of the first group of plurality of interconnecting means and the second group of plurality of interconnection means, and one interconnecting means is further selected out of the selected group (the first group, in this embodiment) of plurality of interconnecting means and is driven by a first driving means 20-1 from a first electrical potential to a second electrical potential while rest of the selected group (the first group, in this embodiment) of plurality of interconnecting means are kept to the first electrical potential and then is made electrically floating with the first driving means being made of a high impedance output state. At the same time, the dummy interconnecting means being disposed parallel to the selected group of plurality of interconnecting means is driven by the first driving means 20-1 from a first electrical potential to a second electrical potential and then is made electrically floating with the first driving means being made of a high impedance output state.

Photo-electrical current from optical sensors connected to the selected one of the selected group (the first group, in this embodiment) of plurality of interconnecting means is sequentially sensed by the current sensing means 20-3 at around the second electrical potential through the selected one of the selected group (the second group, in this embodiment) of plurality of interconnecting means and dummy current from dummy optical sensors connected to the dummy interconnecting means is sequentially sensed by the dummy current sensing means 20-4 at around the second electrical potential through the dummy interconnecting means, by sequentially driving by the second driving means unselected group of plurality of interconnecting means from a third electrical potential to a fourth electrical potential and then from the fourth electrical potential to the third electrical potential while rest of the unselected group (the second group, in this embodiment) of plurality of interconnecting means are kept to the third electrical potential.

Compensated electrical information of each optical sensor is obtained from an output of the differential amplifier 20-5 to one of whose inputs an electrical information from the current sensing means 20-3 is supplied and to the other one of whose inputs an electrical information from the dummy current sensing means 20-4 is supplied. The compensated electrical information is compensated with dark current of an optical sensor and compensated with transient noise by the first and second driving means.

Each dummy interconnecting means to which dummy optical sensors are connected can be furnished neighboring to each of the selected group of the plurality of interconnecting means and compensation in the dark current and in the transient noise through the each of the selected group of the plurality of interconnecting means can be performed by a neighboring optical sensor and a neighboring dummy interconnecting means furnished to the each of the selected group of the plurality of interconnecting means. To select, connect and drive the neighboring dummy interconnecting means, a first driving means is designed to select and drive it from the first electrical potential to the second electrical potential and connect it to the dummy current sensing means.

Embodiment 4

FIG. 6 shows a first example of the first structure of the present invention. FIG. 6-$a$ shows a plan view of the first example. FIG. 6-$b$ shows a cross-sectional view of the first example along a intersection line 3-3 in FIG. 6-$a$ and FIG. 6-$c$ shows a cross-sectional view of the first example along a intersection line 4-4 in FIG. 6-$a$. In the figure, first semiconductor regions of a first conductivity type (e.g. n-type) are disposed on a substrate 110. The first semiconductor regions are arranged side by side in a first direction and are spaced apart each other by twenty first regions 210$s$. To a second direction, the surface regions of the first semiconductor regions are separated by twenty second regions 220$s$. The first semiconductor regions, 100-1-1, 100-1-2, 100-1-$k$, - - - , 100-1-$n$;
100-2-1, 100-2-2, - - - , 100-2-$k$, - - - , 100-2-$n$;
- - - ;
100-$j$-1, 100-$j$-2, - - - , 100-$j$-$k$, - - - , 100-$j$-$n$;
- - - ;
100-$m$-1, 100-$m$-2, - - - , 100-$m$-$k$, - - - , 100-$m$-$n$;
each has a first surface and a first thicknesses;

Here, the letter j and k of 100-$j$-$k$ denotes an arbitrary number. The letter m of 100-$m$-$k$ denotes the total number of the regions 100$s$ disposed toward the first direction and the letter n of 100-$j$-$n$, 101-$j$-$n$, 103-$j$-$n$ denotes the total number of the regions 100$s$ disposed toward the second direction. The letter j, k, m and n will be used similar manner in the present invention. In this embodiment the first semiconductor regions 100-j-1, 100-j-2, - - -, 100-j-k, - - -, 100j-n extend and contact each other in their bottom regions 102-j in the second direction, resulting one continuous region like 100-1, 100-2, - - -, 100-j, - - -, 100-m as shown in FIG. 6-b and FIG. 6-c. The bottom regions (102j) can be of high impurity concentration to make the first semiconductor region of low resistivity for the alternative of the second interconnection and be of low diffusion constant with reference to photo-generated carriers to prevent the intermixing of the photo-generated carriers. These continuous first semiconductor regions play also a role of the second group of plurality of interconnecting means (not shown in FIG. 6) and cited simply as "first semiconductor regions" even when they are used as the second group of plurality of interconnecting means in this embodiment and in the other related embodiments. When carrier diffusion length is smaller than a distance between neighboring second semiconductor regions, the twenty second regions are not necessarily needed. The substrate, twenty first region and twenty second regions can be a semiconductor region of an opposite conductivity type (e.g. p-type), or of insulating material or a semi-insulating semiconductor region such as semi-insulating indium phosphide (InP) or semi-insulating gallium arsenide (GaAs). The twenty first and twenty second regions can also be air gaps. Furthermore the twenty second regions can be semiconductor regions of the first conductivity with high impurity concentration or metal regions, because the first regions are connected each other to the second direction but inter-mixing of photo-generated carriers should be avoided.

As a representative of plural numbers with hyphen, such as 100-1-1, - - -, 100-j-k, - - -, 100-m-n, a number without hyphen such as 100s will be used hereinafter.

In contact with each of the first semiconductor regions 100s, a second semiconductor region 200 of the opposite conductivity type is disposed. The second semiconductor region 200-j-1, 200-j-2, - - -, 200-j-k, - - -, 200-j-n is disposed between the twenty second region, spaced apart each other and each in contact with the first semiconductor region 100-j-1, 100-j-2, - - -, 100-j-k, - - -, 100-j-n. The second semiconductor regions 200-1-1, 200-1-2, - - -, 200-1-k, - - -, 200-1-n;
200-2-1, 200-2-2, - - -, 200-2-k, - - -, 200-2-n;
- - -;
200-j-1, 200-j-2, - - -, 200-j-k, - - -, 200-j-n;
- - -;
200-m-1, 200-m-2, - - -, 200-m-k, - - -, 200-m-n;

each has a second surface and a second thickness.

In contact with the second semiconductor region 200-j-k, a third semiconductor region 300-j-k of the first conductivity type is disposed. The third semiconductor regions 300-1-1, 300-1-2, - - -, 300-1-k, - - -, 300-1-n;
300-2-1, 300-2-2, - - -, 300-2-k, - - -, 300-2-n;
- - -;
300-j-1, 300-j-2, - - -, 300-j-k, - - -, 300-j-n;
300-m-1, 300-m-2, - - -, 300-m-k, - - -, 300-m-n;

each has a third surface and a third thickness.

Further, to prevent surface leakage between the second semiconductor region and the twenty first or twenty second region, a first surface region of the first conductivity type and of high impurity concentration are disposed in the surface of the first semiconductor region, wherein the first surface region 101 disposed between the second semiconductor region and the twenty first region as shown in FIG. 6-b and between the second semiconductor region and the twenty second region.

An insulating layer 123 covers the surfaces of the first, second and third semiconductor regions and, if necessary, the twenty first and twenty second regions. One of the first group of plurality of interconnecting means 1000-k interconnects through contact holes 303-1-k, 303-2-k, - - -, 303-j-k, - - -, 303-m-k in the insulating layer 123 a group of the third semiconductor regions 300-1-k, 300-2-k, - - -, 300-m-k which are arranged to the first direction.

Conductive electrodes 105-1, 105-2, - - -, 105-j, - - -, 105-m are furnished to the first semiconductor regions through contact holes 103-1, 103-2, - - -, 103-j, - - -, 103-m.

Photo-generated carriers in the first semiconductor region and in a part of the second semiconductor region are collected through a first junction between the first semiconductor region and the second semiconductor region and result a first photo-current, Iph1 through the first junction. Photo-generated carriers in the third semiconductor region and the other part of the second semiconductor region are collected through a second junction between the second semiconductor region and the third semiconductor region and result a second photo-current, Iph2. At a steady state condition with the second semiconductor floating, a resultant current, I3 through the third semiconductor region is $\beta$Iph2−(1+$\beta$)Iph1, when the first junction is reverse-biased and the second junction is forward-biased and is (1+$\beta$r)Iph2−$\beta$rIph1, when the first junction is forward-biased and the second junction is reverse-biased. Where, $\beta$ and $\beta$ r is current amplification factor of a transistor comprising the first, second and third semiconductor regions with the above stated respective bias condition. With a bias condition where the both the first and second junction are reverse biased, current I1 through the first region is Iph1 and current I3 through the third semiconductor region is Iph2.

However, in the present invention, the first, second and third semiconductor regions do not be necessarily required to constitute a bipolar transistor and can also be a set of back to back connected diodes, while one of the first and second junctions is used for selecting a sensor out of the optical sensor array. In this case, $\beta$ and $\beta$ r is substantially zero.

When the optical sensor is not illuminated i.e. is in dark, a dark current Id1 across the first junction and a dark current Id2 across the second junction flow under the reverse bias of the each junction.

For the photo-electrical current sense through the first group of plurality of interconnecting means, small Iph2, small Id2, small $\beta$r and small Id1, each small in the absolute value, are preferable.

When the first, the second and third regions are made of compound semiconductors, the energy band gaps of each semiconductor region can be designed to meet the above requirements. For small Iph2 and small Id2, it is preferable that energy band gap of the third semiconductor region is equal or larger than that of the second semiconductor region and/or energy band gap of the second semiconductor region is larger than that of the first semiconductor region. These conditions can be realized by a hetero-epitaxial system of InP, $In_xGa_yAs_zP_qSb_r$ grown on a semi-insulating semiconductor substrate, where the x, y, z, q and r are real numbers from 0 to 1. For detecting an optical image with optical wave length longer than 1.1 micro-meter, the first semiconductor region is made of a material with energy band gap smaller than 1.1 electron volt.

The above conditions are for the case that the selected group of the plurality of interconnecting means are the first group of the plurality of interconnecting means. Conditions for the case that the selected group of the plurality of interconnecting means are the second group of the plurality of interconnecting means are small Iph1 small Id1, small β and small Id2, each small in the absolute value.

When the first, the second and third regions are made of compound semiconductors, the energy band gaps of each semiconductor region can be designed to meet the above requirements. For small Iph1, it is preferable that energy band gap of the first semiconductor region is equal or larger than that of the second semiconductor region and/or energy band gap of the second semiconductor region is larger than that of the third semiconductor region. These conditions can be realized by a hetero-epitaxial system of $In_xGa_yAs_zP_qSb_r$ grown on InP on a semi-insulating InP substrate, where the x, y, z, q and r are real numbers from 0 to 1. For detecting an optical image with optical wave length longer than 1.1 micro-meter, the third semiconductor region is made of a material with energy band gap smaller than 1.1 electron volt.

Embodiment 5

A First Example of Electrical Drive Sequence

The following is one example of electrical drive sequence to read a set of photo-electrical currents converted from an optical information in the optical sensors of the optical sensor array of the present invention, for a case that the selected group of the plurality of interconnecting means are the first group of plurality of interconnecting means;

Firstly, all the second group of plurality of interconnecting means (the first semiconductor regions in the embodiment 4) are set to a third electrical potential and all the first group of plurality of interconnecting means are set to a first electrical potential. Secondly, selected one of the plurality of the first interconnecting means is driven to a second electrical potential and after a transient current through the selected one of the plurality of the first interconnecting means is decreased, each of the second group of plurality of interconnecting means (the first semiconductor regions in the embodiment 4) is sequentially driven to a forth electrical potential and then driven back to the third electrical potential. While the each of the second group of plurality of interconnecting means (the first semiconductor regions in the embodiment 4) is driven to the fourth electrical potential, the photo-electrical current from each of optical sensors having the each of the driven first semiconductor region and being connected to the selected one of the first group of interconnecting means is sensed through the selected one of the first group of plurality of interconnecting means.

An electrical potential of an input terminal of a current sensing means is kept a value near to the second electrical potential as possible at the beginning of the current sense. This can be realized by a current sense amplifier 20-3 with differential inputs like an inverting input 20-3-1 and a non-inverting input 20-3-2. The second potential is supplied to non-inverting input 20-3-2, while the inverting input 20-3-1 is switched to the selected one of the first group of interconnecting means.

As for relations among the first, the second, third and fourth electrical potentials, the following two set of relations are preferable.

A first set of relation between the first and the third electrical potentials and relation between the second and the fourth electrical potentials preferable to efficiently read photo-electrical current from the selected optical sensor is characterized as:

The fourth electrical potential with reference to the second electrical potential is of a polarity forward-biasing the second semiconductor region to the third semiconductor region. And the third electrical potential with reference to the first electrical potential is of a polarity reverse-biasing or zero-biasing the third semiconductor region to the second semiconductor region. This first set is for the case that the third region and the second region form a selection diode or an emitter and base of a transistor.

A second set of relation between the first and the third electrical potentials and relation between the second and the fourth electrical potentials preferable to efficiently read photo-electrical current from the selected optical sensor is characterized as:

The fourth electrical potential with reference to the second electrical potential is of a polarity forward-biasing the second semiconductor region to the first semiconductor region. And the third electrical potential with reference to the first electrical potential is of a polarity reverse-biasing or zero-biasing the first semiconductor region to the second semiconductor region. This second set is for the case that the first region and the second region form a selection diode or an emitter and base of a transistor.

Embodiment 6

A Second Example of Electrical Drive Sequence

The following is another example of electrical drive sequence to read a set of photo-electrical currents converted from an optical information in the optical sensors of the optical sensor array of the present invention, for a case that the selected group of the plurality of interconnecting means are the second group of plurality of interconnecting means;

Firstly, all the second group of plurality of interconnecting means (the first semiconductor regions in the embodiment 4) are set to a first electrical potential and all the first group of plurality of interconnecting means are set to a third electrical potential. Secondly, a selected one of the second group of plurality of interconnecting means (a selected one of the first semiconductor regions in the embodiment 4) is driven to a second electrical potential and after a transient current through the selected one of the second group of plurality of interconnecting means (a selected one of the first semiconductor regions in the embodiment 4) is decreased, each of the first group of plurality of interconnecting means is sequentially driven to a fourth electrical potential and then driven back to the third electrical potential. While the each of the first group of plurality of interconnecting means is driven to the fourth electrical potential, the photo-electrical current from each of optical sensors being connected to selected one of the second group of plurality of interconnecting means (disposed in contact with the selected one of the first semiconductor regions in the embodiment 4) and being connected to the each of the driven first group of plurality of interconnection means is sensed through the selected one of the second group of plurality of interconnecting means.

An electrical potential of an input terminal of a current sensing means is kept a value near to the second electrical potential as possible at the beginning of the current sense. This can be realized by a current sense amplifier 20-3 with differential inputs like an inverting input 20-3-1 and a non-inverting input 20-3-2. The second potential is supplied to non-inverting input 20-3-2, while the inverting input 20-3-1 is switched to the selected one of the second group of interconnecting means.

As for relations among the first, the second, third and fourth electrical potentials, the following two set of relations are preferable.

A first set of relation between the first and the third electrical potentials and relation between the second and the fourth electrical potentials preferable to efficiently read photo-electrical current from the selected optical sensor is characterized as:

The fourth electrical potential with reference to the second electrical potential is of a polarity forward-biasing the second semiconductor region to the third semiconductor region. And the third electrical potential with reference to the first electrical potential is of a polarity reverse-biasing or zero-biasing the third semiconductor region to the second semiconductor region. This first set is for the case that the third region and the second region form a selection diode or emitter and base of a transistor.

A second set of relation between the first and the third electrical potentials and relation between the second and the fourth electrical potentials preferable to efficiently read photo-electrical current from the selected optical sensor is characterized as:

The fourth electrical potential with reference to the second electrical potential is of a polarity forward-biasing the second semiconductor region to the first semiconductor region. And the third electrical potential with reference to the first electrical potential is of a polarity reverse-biasing or zero-biasing the first semiconductor region to the second semiconductor region. This second set is for the case that the first region and the second region form a selection diode or an emitter and base of a transistor.

Embodiment 7

First Driving Means by FETs

The first driving means can be realized by a following first example of FET (field effect transistor) circuit as shown in FIG. 7-a, comprising:

a first group of FETs 5100-1, - - - , 5100-$i$, - - - , 5100-$p$ to one of each source and drain of which the first electrical potential 91 is supplied and the other one of each source and drain of which is connected to each of the selected group of plurality of interconnecting means 4000-1, - - - , 4000-$i$, - - - , 4000-$p$;

a second group of FETs 5200-1, - - - , 5200-$i$, - - - , 5200-$p$ to one of each source and drain of which the second electrical potential 92 is supplied and the other one of each source and drain of which is connected to each of the selected group of plurality of interconnecting means; a third group of FETs 5300-1, - - - , 5300-$i$, - - - , 5300-$p$ one of each source and drain of which is connected to the inverting input 20-3-1 of the current sensing means 20-3 and the other one of each source and drain of which is connected to each of the selected group of plurality of interconnecting means, wherein;

selection of one (4000-$i$) of the selected group of plurality of interconnecting means is made by making a selected one (5100-$i$) of the first group of FETs from "on" to "off", while the other (non-selected) first group of PETs are "on";

and one (5200-$i$) of the second group FETs which is connected to the selected one (4000-$i$) of the selected group of plurality of interconnecting means is made from "off" to "on", while the other second group FETs are "off";

then, one (5300-$i$) of the third group FETs which is connected to the selected one (4000-$i$) of the selected group of plurality of interconnecting means is made from "off" to "on", while the other third group FETs are "off";

and the one (5200-$i$) of the second group FETs which is connected to the selected one (4000-$i$) of the selected group of plurality of interconnecting means is made from "on" to "off";

after that, sensing of the photo-electrical current from optical sensors connected to the selected one of the selected group of plurality of interconnecting means starts by sequentially driving each one of unselected group of plurality of interconnecting means from a third electrical potential to a fourth electrical potential and then from the fourth electrical potential to the third electrical potential while rest of the unselected group of plurality of interconnecting means are kept to the third electrical potential.

In a second example of a circuit for the first driving means, the second group FETs in the first example of the circuit for the first driving means can be replaced by one FET as follows;

as shown in FIG. 7-b, instead of the second group FETs, a fourth FET to one of source and drain of which the second electrical potential is supplied and the other one of source and drain of which is connected to the inverting input of the current sensing means, wherein;

selection of one (4000-$i$) of the selected group of plurality of interconnecting means is made by making a selected one (5100-$i$) of the first group of FETs from "on" to "off", while the other (non-selected) first group of FETs are "on";

the forth FET 5400 is made from "off" to "on";

and one (5300-$i$) of the third group FETs which is connected to the selected one (4000-$i$) of the selected group of plurality of interconnecting means is made from "off" to "on", while the other third group FETs are "off";

after making the forth transistor "off", sensing of the photo-electrical current from optical sensors connected to the selected one of the selected group of plurality of interconnecting means starts by sequentially driving each one of unselected group of plurality of interconnecting means from a third electrical potential to a fourth electrical potential and then from the fourth electrical potential to the third electrical potential while rest of the unselected group of plurality of interconnecting means are kept to the third electrical potential.

In this circuit, when the one of the third group FETs which is connected to the selected one (4000-$i$) of the selected group of plurality of interconnecting means is made from "off" to "on", a large transient current flows to the connection point between the forth FET and the inverting input of the current sensing means through the selected one of the selected group of plurality of interconnecting means and a time to making the fourth FET "off" from "on" is necessary to wait until the transient current becomes small enough. Even in the first example, when the one (5200-$i$) of the second group FETs is made from "off" to "on" this transient current flows into the one (5200-$i$) of the second group FETs through the selected one of the selected group of plurality of interconnecting means and it is necessary to keep the one (5200-$i$) of the second group FETs "on" for a while. Sensing the photo-electrical current from the optical sensors after he transient current reduced is referred as sensing with time delay in the present invention, Embodiment 8

Figure 8:
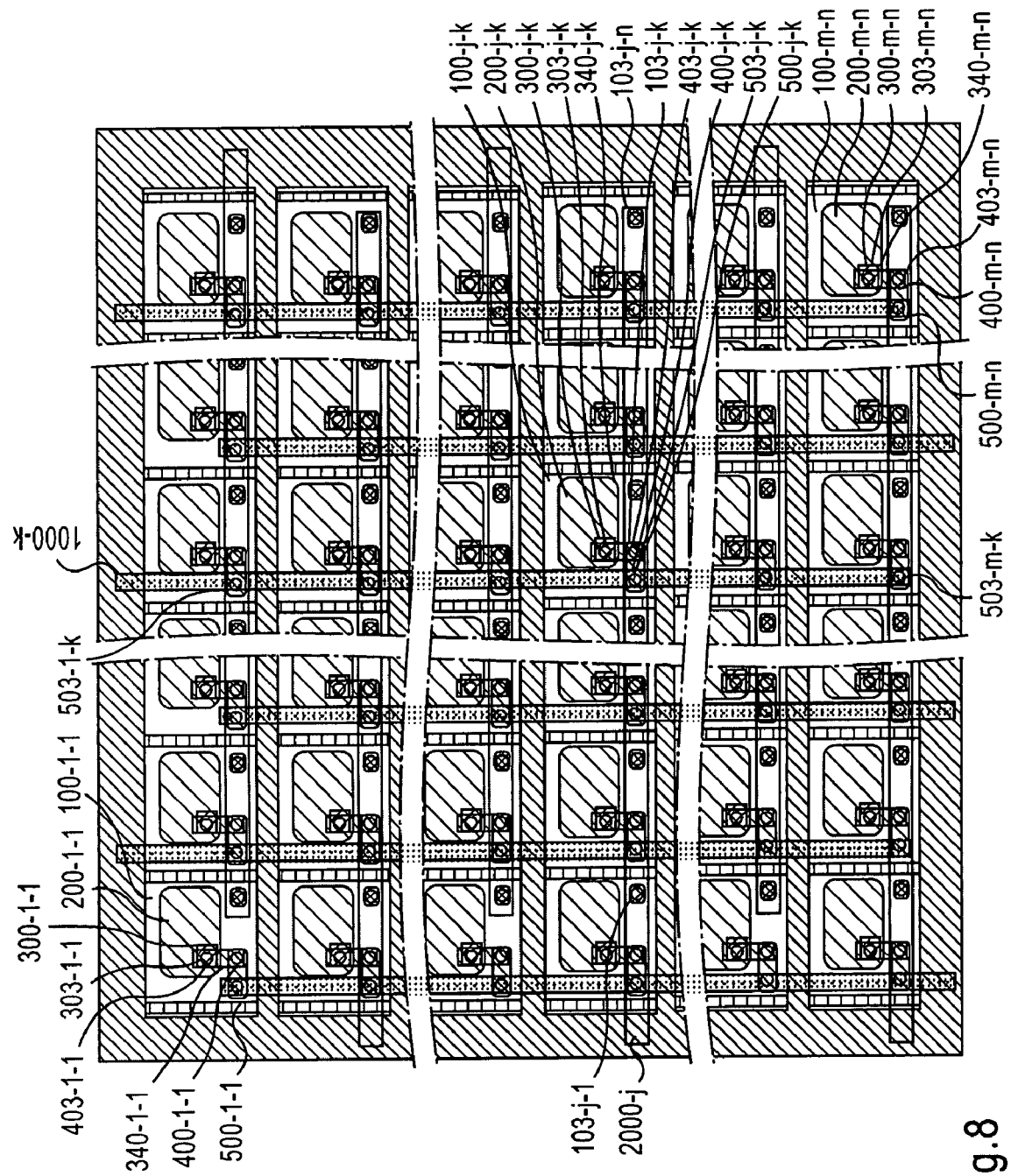
FIG. 8 shows an example of the second structure of the present invention.

FIG. 8 shows an example of the second structure of the present invention. In addition to the regions shown in FIG. 6, fourth semiconductor regions and fifth semiconductor regions are further furnished.

The fourth semiconductor regions 400-1-1, - - - , 400-$j$-$k$, - - - , 400-$m$-$n$ of the opposite conductivity type are each disposed in contact with each of the first semiconductor regions 100-1-1, - - - , **100-*j-k*, - - - , 100-*m-n*, each disposed adjacent to but apart from each of the second semiconductor regions 200-1-1, - - - , 200***j-k*, - - - , **200-*m-n* and each interconnected by each of conductive films 340-1-1, - - - , 340-*j-k*, - - - , 340-*m-n* through each of the contact holes 303-1-1 and 403-1-1, - - - , 303-*j-k* and 403-*j-k*, - - - , 303-*m-n* and 403-*m-n* in an insulating layer 123 (not shown in FIG. 8) to the respective third semiconductor region 300-1-1, - - - , 300-*j-k*, - - - , 300-*m-n* which is in contact with the each adjacent second semiconductor region 200-1-1, - - - , 200***j-k*, - - - , **200-*m-n*. And the fifth semiconductor regions 500-1-1, - - - , 500-*j-k*, - - - , 500-*m-n* of the first conductivity are disposed in contact with each of the fourth semiconductor regions 400-1-1, - - - , 400-*j-k*, - - - , 400-*m-n*.**

Further, first surface regions 101*s* of the first conductivity type and of high impurity concentration (not shown in FIG. 8) are disposed in the surface of the first semiconductor region, wherein the first surface region is disposed among the second semiconductor region, the fourth semiconductor region, the twenty first region and the twenty second region.

An insulating layer covers the surfaces of the first, second, third, fourth, fifth semiconductor regions and, if necessary, the twenty first and twenty second regions. Each of the first group of plurality of interconnecting mean **1000-*k* interconnects instead of third semiconductor regions through contact holes 503-1-*k*, - - - , 503-*j-k*, - - - , 503-*m-k* in the insulating layer 123 (not shown in FIG. 8) the fifth semiconductor regions 500-*l-k*, - - - , 500-*j-k*, - - - , 500-*m-k* which are arranged to the first direction. The second group of plurality of interconnecting mean 2000-*j* interconnects through contact holes 103-*j*-1, - - - , 103-*j-k*, - - - , 103-*j-n* in the insulating layer 123 (not shown in FIG. 8) the first semiconductor regions 100-*j*-1, - - - , 100-*j-k*, - - - , 100-*j-n*** which are arranged to the second direction.

A set of one of the first group of plurality of interconnecting means and one of the second group of plurality of interconnecting means is selected and driven as mentioned in the embodiment 5 or 6 for electrical drive sequences to read the electrical information from the selected optical sensor.

This embodiment for the second structure allows a larger voltage difference between the first electrical potential and the third electrical potential than the embodiment 4. Thus large dynamic range is realized.

A current gain larger than that of embodiment 4 also realized when the first semiconductor region, the forth semiconductor region and the fifth semiconductor region constitute an amplifying transistor. Thus higher sensitivity and improved signal to noise ratio is obtained.

Embodiment 9

Figure 9:
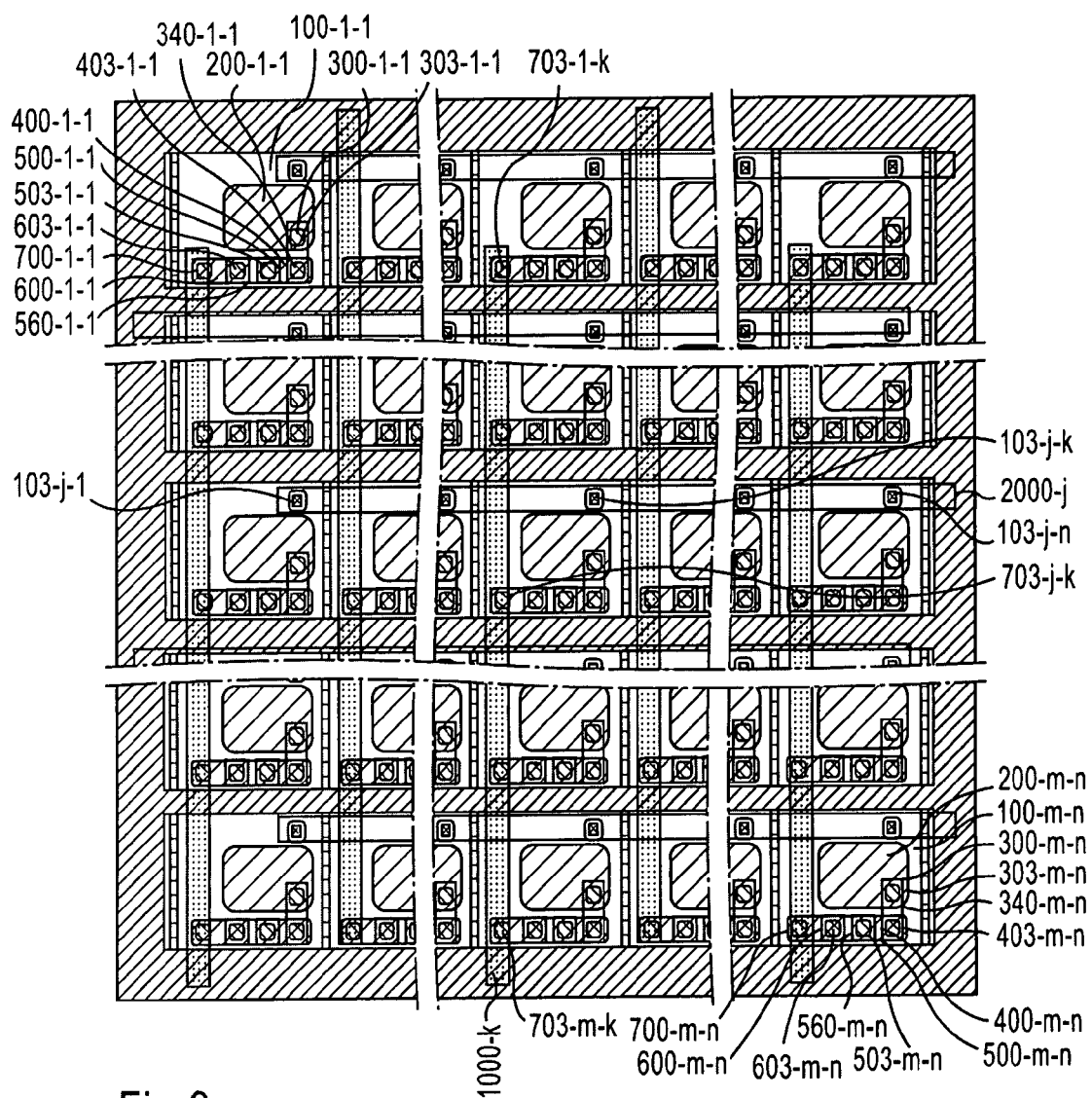
FIG. 9 shows an example of the third structure of the present invention.

FIG. 9 shows an example of the third structure of the present invention. In addition to the regions shown in FIG. 8, sixth semiconductor regions and seventh semiconductor regions are further furnished.

The sixth semiconductor regions 600-1-1, - - - , **600-*j-k* (not shown in FIG. 9), - - - , 600-*m-n* of the opposite conductivity type are provided in contact with the first semiconductor regions 100-1-1, - - - , 100-*j-k* (not shown in FIG. 9), - - - , 100-*m-n*, each disposed adjacent to but apart from each of the second semiconductor regions 200-1-1, - - - , 200-*j-k* (not shown in FIG. 9), - - - , 200-*m-n* and from each of the fourth semiconductor regions 400-1-1, - - - , 400-*j-k* (not shown in FIG. 9), - - - , 400-*m-n* and each interconnected by each of conductive films 560-1-1, - - - , 560-*j-k* (not shown in FIG. 9), - - - , 560-*m-n* through each of the contact holes 503-1-1 and 603-1-1, - - - , 503-*j-k* (not shown in FIG. 9) and 603-*j-k* (not shown in FIG. 9), - - - , 503-*m-n* and 603-*m-n* to the respective fifth semiconductor region 500-1-1, - - - , 500-*j-k* (not shown in FIG. 9), - - - , 500-*m-n* which is in contact with the each adjacent fourth semiconductor region 400-1-1, - - - , 400-*j-k* (not shown in FIG. 9), 400-*m-n*. And the seventh semiconductor regions 700-1-1, - - - , 700-*j-k* (not shown in FIG. 9), - - - , 700-*m-n* of the first conductivity are disposed in contact with each of the sixth semiconductor regions 600-1-1, - - - , 600-*j-k* (not shown in FIG. 9), - - - , 600-*m-n*.**

The first surface regions (not shown in FIG. 9) of the first conductivity type and of high impurity concentration are disposed in the surface of the first semiconductor region, wherein the first surface region disposed among the second semiconductor region, the fourth semiconductor region, the sixth semiconductor region, the twenty first region and the twenty second region.

An insulating layer 123 (not shown in FIG. 9) covers the surfaces of the first, second, third, fourth, fifth, sixth, seventh semiconductor regions and, if necessary, the twenty first and twenty second regions. The first group of plurality of interconnecting means **1000-*k* interconnect, instead of the fifth semiconductor regions, through contact holes 703-1-*k*, - - - , 703-*j-k*, - - - , 703-*m-k* in the insulating layer 123 the seventh semiconductor regions 700-1-*k*, - - - , 700-*j-k* (not shown in FIG. 9), - - - , 700-*m-k* which are arranged to the first direction. The second group of plurality of interconnecting mean 2000-*j* interconnects through contact holes 103-*j*-1, - - - , 103-*j-k*, - - - , 103-*j-n* in the insulating layer 123 (not shown in FIG. 9) the first semiconductor regions 100-*j*-1, - - - , 100-*j-k* (not shown in FIG. 9), - - - , 100-*j-n*** which are arranged to the second direction.

A set of one of the first group of plurality of interconnecting means and one of the second group of plurality of interconnecting means is selected and driven as mentioned in the embodiment 5 or 6 for electrical drive sequences to read the electrical information from the selected optical sensor.

This embodiment for the third structure allows a larger voltage difference between the first electrical potential and the third electrical potential than the embodiment 8. Thus further larger dynamic range is realized.

A current gain larger than that of embodiment 8 is also realized when the first semiconductor region, the sixth semiconductor region and the seventh semiconductor region constitute an amplifying transistor. Thus higher sensitivity and improved signal to noise ratio is obtained.

Embodiment 10

Figure 10:
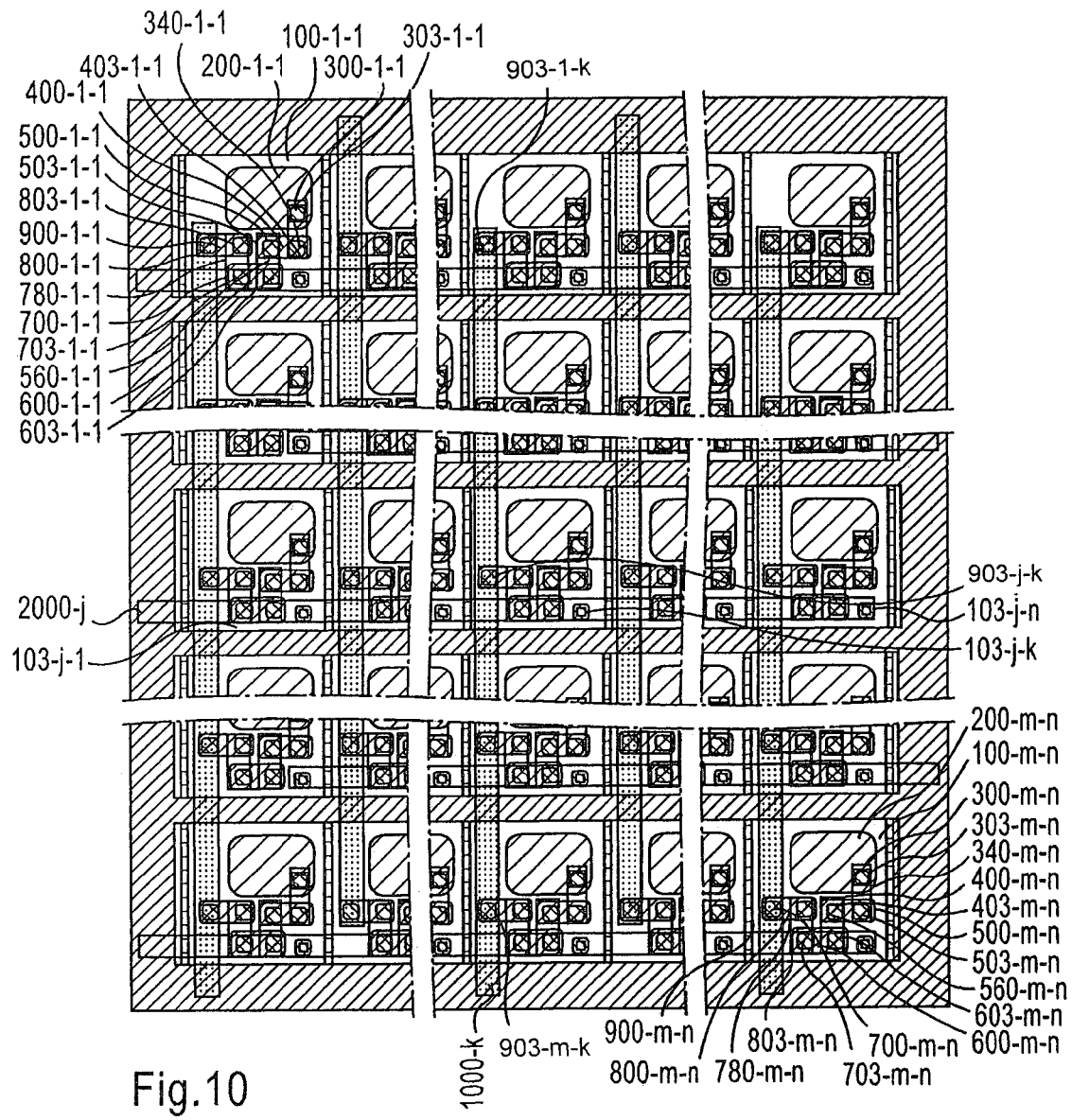
FIG. 10 shows an example of the fourth structure of the present invention.

FIG. 10 shows an example of the fourth structure of the present invention. In addition to the regions shown in FIG. 9, eighth semiconductor regions and ninth semiconductor regions are further furnished.

The eighth semiconductor regions 800-1-1, - - - , **800-*j-k* (not shown in FIG. 10), - - - , 800-*m-n* of the opposite conductivity type are provided in contact with the first semiconductor regions 100-1-1, - - - , 100-*j-k* (not shown in FIG. 10), - - - , 100-*m-n*, each disposed adjacent to but apart from each of the second semiconductor regions 200-1-1, - - - , 200-*j-k* (not shown in FIG. 9), - - - , 200-*m-n*, from each of the fourth semiconductor regions 400-1-1, - - - , 400-*j-k* (not shown in FIG. 9), - - - , 400-*m-n* and from each of the sixth semiconductor regions 600-1-1, - - - , 600-*j-k* (not shown in FIG. 9), - - - , 600-*m-n* and each interconnected by each of conductive films 780-1-1, - - - , 780-*j-k* (not shown in FIG. 10), - - - , 780-*m-n* through each of the contact holes 703-1-1 and 803-1-1, - - - , 703-*j-k* (not shown in FIG. 9) and 803-*j-k***

(not shown in FIG. 10), - - - , 703-$m$-$n$ and 803-$m$-$n$ to the respective seventh semiconductor region 700-1-1, - - - , 700-$j$-$k$ (not shown in FIG. 10), - - - , 700-$m$-$n$ which is in contact with the each adjacent sixth semiconductor region 600-1-1, - - - , 600$j$-$k$ (not shown in FIG. 10), - - - , 600-$m$-$n$. And the ninth semiconductor regions 900-1-1, - - - , 900-$j$-$k$ (not shown in FIG. 10), - - - , 900-$m$-$n$ of the first conductivity are disposed in contact with each of the eighth semiconductor regions 800-1-1, - - - , 800-$j$-$k$ (not shown in FIG. 10), - - - , 800-$m$-$n$.

The first surface regions 110$s$ (not shown in FIG. 10) of the first conductivity type and of high impurity concentration are disposed in the surface of the first semiconductor region, wherein the first surface region disposed among the second, fourth, sixth, eighth semiconductor region and the twenty first and twenty second region.

An insulating layer 123 (not shown in FIG. 10) covers the surfaces of the first, second, third, fourth, fifth, sixth, seventh, eighth, ninth semiconductor regions and, if necessary, the twenty first and twenty second regions. The first group of plurality of interconnecting means 1000-$k$ interconnect, instead of the seventh semiconductor regions, through contact holes 903-1-$k$, - - - , 903-$j$-$k$, - - - , 903-$m$-$k$ in the insulating layer 123 the ninth semiconductor regions 900-1-$k$, (not shown in FIG. 10), - - - , 900-$j$-$k$ (not shown in FIG. 10), - - - , 900-$m$-$k$ (not shown in FIG. 10) which are arranged to the first direction. The second group of plurality of interconnecting mean 2000-$j$ interconnects through contact holes 103-$j$-1, - - - , 103-$j$-$k$, - - - , 103-$j$-$n$ in the insulating layer 123 the first semiconductor regions 100-$j$-1 (not shown in FIG. 10), - - - , 100-$j$-$k$ (not shown in FIG. 10), - - - , 100-$j$-$n$ which are arranged to the second direction.

A set of one of the first group of plurality of interconnecting means and one of the second group of plurality of interconnecting means is selected and driven as mentioned in the embodiment 5 or 6 for electrical drive sequences to read the electrical information from the selected optical sensor.

This embodiment for the fourth structure allows a larger voltage difference between the first electrical potential and the third electrical potential than the embodiment 9. Thus further larger dynamic range is realized.

A current gain larger than that of embodiment 9 is also realized when the first semiconductor region, the eighth semiconductor region and the ninth semiconductor region constitute an amplifying transistor. Thus higher sensitivity and improved signal to noise ratio is obtained.

Embodiment 11

The above structures can be made by using silicon (Si), germanium (Ge), $Si_{1-x}Ge_x$, gallium arsenide (GaAs) and it's lattice matched family (such as GaAlAs, e.t.c.), indium phosphide (InP) and it's lattice matched family ($In_xGa_yAs_zP_qSb_r$, where the x, y, z, q and r are real numbers from 0 to 1) according to the wave length of optical image to be detected and availability of the fabrication process and fabrication cost. FIG. 11-$a$, 11-$b$ and 11-$c$ show a process step for fabricating an example of a fifth structure according to the present invention and FIG. 11-$d$, 11-$e$, 11-$f$ shows cross sections and a plan view of the thus obtained fifth structure. In this embodiment, a long wave length optical sensor array with a small photolithography-process step is disclosed as follows:

1. to clean and prepare a semi-insulating an InP wafer(s), 2. to epitaxially grow on the wafer 110 an InP layer (100-0) with the thickness of 5~7 micrometer and high impurity concentration (e.g. $5\times10^{18}$ atoms/cc) of a first conductivity type, 3. to continue epitaxial growth of a first $In_{0.53}Ga_{0.47}As$ layer 200-0 with sub-micrometer thick and of an opposite conductivity type with medium to low impurity concentration (e.g. $1\times10^{17}$ atoms/cc), 4. before the growth of the above first $In_{0.53}Ga_{0.47}As$ layer, a buffer layer (such as InP) with low impurity concentration may be grown.

5. to further continue epitaxial growth of a second $In_{0.53}Ga_{0.47}As$ layer 300-0 with several micrometer thick and of first conductivity type with low impurity concentration (e.g. $2\sim5\times10^{16}$ atoms/cc) but high impurity concentration (e.g. $2\times10^{18}$ atoms/cc) at final stage (see FIG. 11-$a$), 6. to coat a photoresist layer on the epitaxially grown wafer and expose a first isolation pattern, 7. with the patterned photoresist layer as an etching mask, to selectively etch (e.g. by a mixture of phosphoric acid and hydrogen peroxide or by dry etching) the first and second $In_{0.53}Ga_{0.47}As$ layers and the etching stops at the $In_{0.53}Ga_{0.47}As$/InP interface and to form trenches 321$s$ (see FIG. 11-$b$), 8. to remove the above photoresist layer and clean the wafer surface, 9. to coat a photoresist layer on the epitaxially grown wafer and expose a second isolation pattern, 10. with the patterned photoresist layer as an etching mask, to etch (e.g. by a diluted mixture of hydrochloric acid and phosphoric acid) the epitaxially grown InP layer down to a surface of the substrate to form trenches 3210$s$ for the twenty first region.

11. to remove the above photoresist layer and clean the wafer surface, 12. to grow semi-insulating InP layer or to coat insulating layer (organic film like polyimide or epoxy compound, or silicon nitride) on the wafer.

13. to coat a photoresist layer on the above wafer and expose a contact pattern, 14. with the patterned photoresist layer as an etching mask, to etch contact holes (303$s$, 103$s$) through the semi-insulating layer or the insulating layer 123 (see FIG. 11-$c$), 15 to remove the above photoresist layer and clean the wafer surface, 16. to deposit a metal layer(s) (e.g. Al/Ti) on the wafer with contact holes, 17. to coat a photoresist layer on the above deposited wafer and expose a interconnecting pattern, 18. with the patterned photoresist layer as a etching mask, to etch unnecessary parts of the metal layer to form the first group of plurality of interconnecting means 1000-1, - - - , 1000-$k$, - - - , 1000-$n$ and conductive electrodes 105-1, - - - , 105-$j$, - - - , 105-$m$ to the epitaxially grown InP layer as a part of the second group of plurality of interconnecting means, 19. to remove the above photoresist layer and clean the wafer surface.

As a result a structure of optical sensor array shown in FIG. 11-$d$, FIG. 11$e$ and FIG. 11-$f$ is obtained. FIG. 11-$e$ shows a cross-sectional view of the optical sensor array along line 3-3 on FIG. 11-$f$ and FIG. 11-$d$ shows a cross-sectional view of the optical sensor array along line 4-4 of FIG. 11-$f$. The first semiconductor regions 100-1, - - - , 100-$j$, - - - , 100-$m$-$n$ are formed by separating the epitaxially grown InP layer by the trenches 3210$s$. The second semiconductor regions 200-1-1, - - - , 200-1-$k$, - - - , 200-$j$-1, - - - , 200-$i$-$k$, - - - , 200-$m$-$k$ (not shown in FIG. 11-$f$), - - - , 200-$j$-$n$, - - - , 200-$m$-$n$ are formed by separating the epitaxially grown first $In_{0.53}Ga_{0.47}As$ layer by the trenches 321$s$ and 3210$s$ and the third semiconductor regions 300-1-1, - - - , 300-1-$k$, - - - , 300-$j$-1, - - - , 300-$j$-$k$, - - - , 300-$m$-$k$ (not shown in FIG. 11-$f$), - - - , 300-j-n, - - -, 300-m-n are formed by separating the epitaxially grown first $In_{0.53}Ga_{0.47}As$ layer by the trenches 321s and 3210s. The trenches 321s and 3210s filled or coated with the semi-insulating InP or the insulator film form regions 220s and 210s. This optical sensor array can detect a optical image with optical wavelength of 1.7 micrometer and shorter. The second and third semiconductor regions does not necessarily be $In_{0.53}Ga_{0.47}As$ layers and can be any semiconductor layers such as GaAsSb, more generally $In_xGa_yAs_zSb_r$ layers, where x, y, z and r is a real number from 0 to 1, which have a capability of epitaxially growth on the first semiconductor region. The first semiconductor region is not necessarily epitaxially grown on the substrate and can be lattice-mismatched with the substrate.

Generally this structure is characterized as follows:

an optical sensor array comprising:

a semi-insulating substrate;

first semiconductor regions of a first conductivity type grown on the substrate;

the first semiconductor regions are disposed spaced apart each other in a first direction;

second semiconductor regions of an opposite conductivity type epitaxially grown on the first semiconductor regions and being disposed in the first direction and in the second direction.

the first direction and second direction intersecting each other;

third semiconductor regions each epitaxially grown on each of the second semiconductor regions and being disposed in the first and second direction;

a first interconnecting means interconnecting the third semiconductor regions in the first direction.

A driving method described in the embodiment 5 or 6 can be applicable to this embodiment 11.

Embodiment 12

A semiconductor wafer in which groups of the first semiconductor regions each with the second and third region in the embodiment 4 and 11, or the first semiconductor regions each with the second, third, fourth and fifth region in the embodiment 8, or the first semiconductor regions each with the second, third, fourth, fifth, sixth and seventh region in the embodiment 9, or the first semiconductor regions with the second, third, fourth, fifth, sixth, seventh, eighth and ninth region in the embodiment 10 are formed is attached on an insulating substrate and is diced through to the substrate to separate each first semiconductor region spaced apart from each other and insulated each other on the substrate. Furthermore, the first semiconductor region has a first opposed surface opposed to the first surface and conductive layer is attached to the first semiconductor region on the first opposed surface. Each of the first semiconductor regions can also be attached to each of conductive layers which are disposed spaced apart from each other on an insulating substrate.

Embodiment 13

In the first, second, third or fourth structure, the plurality of interconnecting means can be conductive thin film layers or metal wires. The metal wires are convenient for arrays with small pixel number to be completed with small number of photo-masks and process steps or with discretionary wiring by a wire bonding technology.

Embodiment 14

By using above mentioned structures made by silicon and the dark current compensation, the following sensitivity of each optical sensor is obtained as shown in Table 1.

TABLE 1 measured sensitivity

| optical sensor structure | obtained sensitivity | light power measured at |
| --- | --- | --- |
| structure 1 | 700 A/W | 1 micro-watt |
| structure 2 | 2 KA/W | 0.1 micro-watt |
| structure 3 | 300 KA/W | 1 nano-watt |
| structure 4 | 20 MA/W | 10 pico-watt |

In the above table, wave length of light used in the measurement is 632.8 nm and environmental temperature in the measurement is room temperature.

Thicknesses, conductivity type and impurity concentrations of the each semiconductor region for the above optical sensors are listed in Table 2.

TABLE 2 thickness, conductivity type and impurity concentration

| semi-conductor region(s) | thickness | conductivity type | impurity concentration |
| --- | --- | --- | --- |
| first | 30 μm | n | ~1E14 atoms/cc |
| second, fourth | around 2 μm adjusted for a current gain > 2000 | p | ~1E18 atoms/cc at the surface |
| third, fifth | around 1.5 μm adjusted for a current gain > 2000 | n | ~1E21 atoms/cc at the surface |

Furthermore, by using a short pulse in the driving method of the present invention with the first electrical potential=3.5 volt, the second electrical potential=0 volt, the third electrical potential=0 volt, the fourth electrical potential=3 volt and pulse width of 20 micro-second for driving the second plurality of interconnecting means from the third electrical potential to the fourth electrical potential and back to the third electrical potential by the second driving means, sensitivity was found to improved by 30 to a long pulse or static sensing method even at a light intensity of 1 pico-watt and noise equivalent power (NEP) of $9E-17$ $W/Hz^{1/2}$ or less was attained by an optical array sensor like embodiment 3.

Thus according to the present invention, a optical sensor array with a high sensitivity or high signal to noise ratio or high speed sense is obtained.

Embodiment 15

Figure 12:
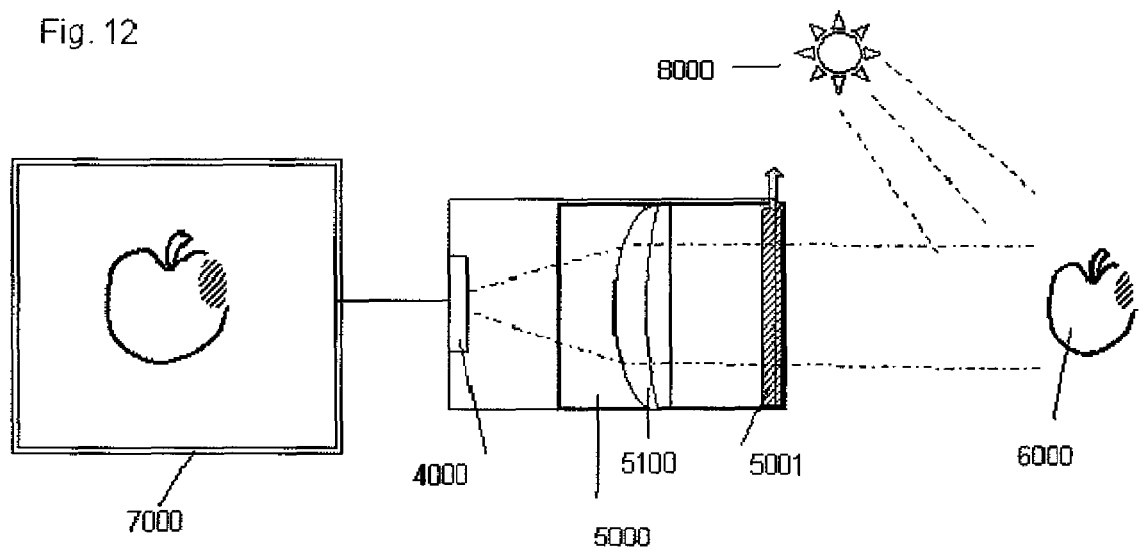
FIG. 12 shows an apparatus for optical imaging according to the present invention.

An apparatus for optical imaging is provided using an optical sensor array device according to one selected from embodiment 1, embodiment 2, embodiment 3 and their variations. As shown in FIG. 12, the apparatus comprises at least the optical imaging device 4000 and an optical imaging means 5000 focusing an optical image of an object 6000 on the optical imaging device. The apparatus may further comprise a display means 7000 which displays an image according to data from the current sensing means or the correction circuit or the differential circuit.

The optical imaging means comprises optical lens assembly 5100 or concave mirror assembly to focus an optical image of the object on the optical sensor array device and further comprises a shutter 5001 if necessary. The concave mirror assembly is used for a high sensitivity system like an astronomical telescope. An illuminator 8000 with an adequate light wave length will be necessary for the non-light emitting object. The display can be a LCD display or an electro-luminescent display. A display for a personal computer can be also used for this purpose.

What is claimed is:

1. An optical sensor array comprising:
    optical sensors disposed in a first direction and in a second direction;
    a first group of plurality of interconnecting means extending in said first direction;
    a second group of plurality of interconnecting means extending in said second direction;
    said first group of plurality of interconnecting means and said second group of plurality of interconnecting means being insulated each other and intersecting each other;
    each one of said optical sensors being connected to one of said first group of plurality of interconnecting means and to one of said second group of plurality of interconnecting means;
    an optical sensor being selected from said optical sensors at a cross-point of selected one of said first group of plurality of interconnecting means and selected one of said second group of plurality of interconnecting means, wherein;
    selected one group of plurality of interconnecting means are selected out of said first group of plurality of interconnecting means and said second group of plurality of interconnection means, and selected one of said selected group of plurality of interconnecting means is further selected and is driven from a first electrical potential to a second electrical potential while rest of said selected group of plurality of interconnecting means are kept to said first electrical potential, wherein;
    photo-electrical current from optical sensors connected to said selected one of said selected group of plurality of interconnecting means is sequentially sensed at around said second electrical potential through said selected one of said selected group of plurality of interconnecting means,
    by sequentially driving each one of unselected group of plurality of interconnecting means from a third electrical potential to a fourth electrical potential and then from said fourth electrical potential to said third electrical potential while rest of said unselected group of plurality of interconnecting means are kept to said third electrical potential;
    said fourth electrical potential supplied to said optical sensor through said one of said unselected group of plurality of interconnecting means and said second electrical potential supplied to said selected optical sensor through said selected one of said selected group of plurality of interconnecting means making said photo-electrical current from said selected optical sensor available;
    said third electrical potential supplied to said optical sensor through said one of said unselected group of plurality of interconnecting means and said first electrical potential supplied to said selected optical sensor through said selected one of said selected group of plurality of interconnecting means making the photo-electrical current from said selected optical sensor unavailable except a leakage current.

2. An optical sensor array according to claim 1, further comprising:
    a first driving means driving one of said selected group of plurality of interconnecting means from said first electrical potential to said second electrical potential and from said second electrical potential to said first electrical potential while keeping rest of said selected group of plurality of interconnecting means to said first electrical potential;
    said first driving means being of electrically high impedance during photo-electrical current from said selected optical sensors is sensed, after driving said one of said selected group of plurality of interconnecting means from said first electrical potential to said second electrical potential.

3. An optical sensor array comprising;
    first semiconductor regions of a first conductivity, each having a first thickness and a first surface, being disposed in a first direction and a second direction and being spaced apart each other at least in one out of said first direction and said second direction;
    said first direction and said second direction intersecting each other;
    second semiconductor regions of an opposite conductivity type, each having a second thickness and a second surface, being disposed in contact with each of the first semiconductor regions and being spaced apart each other;
    third semiconductor regions of the first conductivity type, each having a third thickness and a third surface, being disposed in contact with each of said second semiconductor regions;
    said third semiconductor region being disposed in said first direction and in said second direction;
    a first group of plurality of interconnecting means being insulated from each other and insulated from the first semiconductor regions and the second semiconductor regions and each interconnecting said third semiconductor regions disposed in the first direction;
    a second group of plurality of interconnecting means being insulated from each other, insulated from said first group of plurality of interconnecting means and insulated from the second semiconductor regions and the third semiconductor regions and each interconnecting said first semiconductor regions disposed in the second direction;
    an optical sensor being selected at a cross-point of one of the first group of plurality of interconnecting means and one of the second group of plurality of interconnecting means;
    said optical sensor comprising said first semiconductor region, said second semiconductor region in contact with said first semiconductor region and said third semiconductor region in contact with said second semiconductor region;
    wherein;
    selected one group of plurality of interconnecting means are selected out of said first group of plurality of interconnecting means and said second group of plurality of interconnection means, and selected one of said selected group of plurality of interconnecting means is further selected and is driven from a first electrical potential to a second electrical potential while rest of said selected group of plurality of interconnecting means are kept to said first electrical potential, wherein;
photo-electrical current from said selected one of said selected group of plurality of interconnecting means is sequentially sensed at around said second electrical potential through said selected one of said selected group of plurality of interconnecting means,
by sequentially driving each one of unselected group of plurality of interconnecting means from a third electrical potential to a fourth electrical potential and then from said fourth electrical potential to said third electrical potential while rest of said unselected group of plurality of interconnecting means are kept to said third electrical potential,
wherein;
said fourth electrical potential with reference to said second electrical potential is of a polarity forward-biasing the second semiconductor region to the third semiconductor region;
and said third electrical potential with reference to said first electrical potential is of a polarity reverse-biasing or zero-biasing the third semiconductor region to the second semiconductor region,
or wherein;
said fourth electrical potential with reference to said second electrical potential is of a polarity forward-biasing the second semiconductor region to the first semiconductor region;
and said third electrical potential with reference to said first electrical potential is of a polarity reverse-biasing or zero-biasing the first semiconductor region to the second semiconductor region.

4. An optical sensor array according to claim 3, further comprising:
a first driving means driving one of said selected group of plurality of interconnecting means from a first electrical potential to a second electrical potential and from said second electrical potential to said first electrical potential while keeping rest of said selected group of plurality of interconnecting means to said first electrical potential;
said first driving means being of electrically high impedance during photo-electrical current from said selected one of said selected group of plurality of interconnecting means is sensed, after driving said selected one of said selected group of plurality of interconnecting means from said first electrical potential to said second electrical potential.

5. An optical sensor array according to claim 3, wherein;
said first semiconductor regions disposed in the second direction are in contact with each other in the second direction and interconnect themselves as one of said second group of plurality of interconnecting means instead of the one of said second group of plurality of interconnecting means.

6. An optical sensor array according to claim 3, further comprising;
fourth semiconductor regions of the opposite conductivity type each disposed in contact with each of said first semiconductor regions, each disposed adjacent to but apart from each of said second semiconductor regions and each interconnected to the third semiconductor region being in contact with said each of said second semiconductor regions;
fifth semiconductor regions of the first conductivity type each disposed in contact with each of said fourth semiconductor regions;
said fourth semiconductor regions and said fifth semiconductor regions being disposed in said first direction and in said second direction;
said optical sensor further comprising said fourth semiconductor region in contact with said first semiconductor region and said fifth semiconductor region in contact with said fourth semiconductor region;
said first group of plurality of interconnecting means insulated from each other and insulated from the first, the second, the third and the fourth semiconductor regions and each interconnecting instead of said plurality of the third semiconductor region said fifth semiconductor regions disposed in the first direction.

7. An optical sensor array according to claim 6, wherein;
said first semiconductor regions disposed in the second direction are in contact with each other in the second direction and interconnect themselves as one of said second group of plurality of interconnecting means instead of the one of said second group of plurality of interconnecting means.

8. An optical sensor array according to claim 6, further comprising:
sixth semiconductor regions of the opposite conductivity type each disposed in contact with each of said first semiconductor regions, each disposed apart from each of said second and fourth semiconductor regions and interconnected to the fifth semiconductor region being in contact with said each of said fourth semiconductor regions;
seventh semiconductor regions of the first conductivity type each disposed in contact with each of said sixth semiconductor regions;
said sixth semiconductor regions and said seventh semiconductor regions being disposed in said first direction and in said second direction;
said optical sensor further comprising said sixth semiconductor region in contact with said first semiconductor region and said seventh semiconductor region in contact with said sixth semiconductor region;
said first group of plurality of interconnecting means insulated from each other and insulated from the first, the second, the third, the fourth, the fifth and sixth semiconductor regions and each interconnecting instead of said fifth semiconductor regions said plurality of seventh semiconductor regions in the first direction.

9. An optical sensor array according to claim 8, wherein;
said first semiconductor regions disposed in the second direction are in contact with each other in the second direction and interconnect themselves as one of said second group of plurality of interconnecting means instead of the one of said second group of plurality of interconnecting means.

10. An optical sensor array according to claim 8, further comprising:
eighth semiconductor regions of the opposite conductivity type each disposed in contact with each of said first semiconductor regions, each disposed apart from each of said second, fourth and sixth semiconductor regions and interconnected to each of the seventh semiconductor regions being in contact with said each of said sixth semiconductor regions;
ninth semiconductor regions of the first conductivity type each disposed in contact with each of said eighth semiconductor regions;
said eighth semiconductor regions and said ninth semiconductor regions being disposed in said first direction and in said second direction;

said optical sensor further comprising said eighth semiconductor region in contact with said first semiconductor region and said ninth semiconductor region in contact with said eighth semiconductor region;

said first group of plurality of interconnecting means insulated from each other and insulated from the first, the second, the third, the fourth, the fifth, the sixth, the seventh and eighth semiconductor regions and each interconnecting, instead of said seventh semiconductor regions, said plurality of the ninth semiconductor regions in the first direction.

11. An optical sensor array according to claim 10, wherein;
said first semiconductor regions disposed in the second direction are in contact with each other in the second direction and interconnect themselves as one of said second group of plurality of interconnecting means instead of the one of said second group of plurality of interconnecting means.

12. An optical sensor array according to claim 2, further comprising:
a current sensing means having a non-inverting input and an inverting input;
said non-inverting input being connected to said second electrical potential and said inverting input being switched to said selected one of the selected group of the plurality of interconnecting means and photo-electrical current from the selected optical sensor being sensed during said first driving means is of electrically high impedance.

13. An optical sensor array according to claim 4, further comprising:
a current sensing means having a non-inverting input and an inverting input;
said non-inverting input being connected to said second electrical potential and said inverting input being switched to said selected one of the selected group of the plurality of interconnecting means and photo-electrical current from the selected one of the selected group of the plurality of interconnecting means being sensed during said first driving means is of electrically high impedance.

14. An optical sensor array according to claim 12, wherein;
said current sensing means is switched with a delay time to said one of the selected group of the plurality of interconnecting means and starts to sense photo-electrical current from the selected optical sensor, after a voltage transient from said first electrical potential to said second electrical potential on said one of selected group of interconnecting means.

15. An optical sensor array according to claim 13, wherein;
said current sensing means is switched with a delay time to said one of the selected group of the plurality of interconnecting means and starts to sense photo-electrical current from the selected optical sensor, after a voltage transient from said first electrical potential to said second electrical potential on said one of selected group of interconnecting means.

16. A driving means for an optical sensor array according to claim 1 or 3, comprising:
a first group of field effect transistors to one of each source and drain of which said first electrical potential is supplied and the other one of each source and drain of which is connected to each of said selected group of plurality of interconnecting means;
a second group of field effect transistors to one of each source and drain of which said second electrical potential is supplied and the other one of each source and drain of which is connected to each of said selected group of plurality of interconnecting means;
a third group of field effect transistors one of each source and drain of which is connected to an inverting input of said current sensing means and the other one of each source and drain of which is connected to each of said selected group of plurality of interconnecting means, wherein;
selection of one of the selected group of plurality of interconnecting means is made by making a selected one of the first group of field effect transistors from "on" to "off", while the other (non-selected) first group of field effect transistors are "on";
and one of the second group of field effect transistors which is connected to said selected one of the selected group of plurality of interconnecting means is made from "off" to "on", while the other second group field effect transistors are "off";
then, one of the third group field effect transistors which is connected to said selected one of the selected group of plurality of interconnecting means is made from "off" to "on", while the other third group field effect transistors are "off";
said one of the second group of field effect transistors which is connected to said selected one of the selected group of plurality of interconnecting means is made from "on" to "off";
after that, sensing of the photo-electrical current from optical sensors connected to the selected one of the selected group of plurality of interconnecting means starts by sequentially driving each one of unselected group of plurality of interconnecting means from a third electrical potential to a fourth electrical potential and then from said fourth electrical potential to said third electrical potential while rest of said unselected group of plurality of interconnecting means are kept to said third electrical potential.

17. A driving means according to claim 16, comprising;
instead of the second group field effect transistors, a fourth field effect transistor to one of source and drain of which said second electrical potential is supplied and the other one of source and drain of which is connected to the inverting input of the current sensing means, wherein;
selection of one of the selected group of plurality of interconnecting means is made by making a selected one of the first group of field effect transistors from "on" to "off", while the other (non-selected) first group of field effect transistors are "on";
then, the forth transistors is made from "off" to "on";
and one of the third group field effect transistors which is connected to said selected one of the selected group of plurality of interconnecting means is made from "off" to "on", while the other third group field effect transistors are "off";
after making the forth transistor "off", sensing of the photo-electrical current from optical sensors connected to the selected one of the selected group of plurality of interconnecting means starts by sequentially driving each one of unselected group of plurality of interconnecting means from a third electrical potential to a fourth electrical potential and then from said fourth electrical potential to said third electrical potential while rest of said unselected group of plurality of interconnecting means are kept to said third electrical potential.

18. An optical sensor array comprising:
first semiconductor regions of a first conductivity, each having a first thickness and a first surface, being disposed in a first direction and a second direction and being spaced apart each other at least in one out of said first direction and said second direction;

said first direction and said second direction intersecting each other;

second semiconductor regions of an opposite conductivity type each having a second thickness and a second surface, being disposed in contact with each of the first semiconductor regions and being spaced apart each other;

third semiconductor regions of the first conductivity type each having a third thickness and a third surface and being disposed in contact with each of said second semiconductor regions;

said third semiconductor regions being disposed in said first direction and in said second direction;

fourth semiconductor regions of the opposite conductivity type each disposed in contact with each of said first semiconductor regions, each disposed adjacent to but apart from each of said second semiconductor regions and each interconnected to each of the third semiconductor regions being in contact with said each of said second semiconductor regions;

fifth semiconductor regions of the first conductivity type each disposed in contact with each of said fourth semiconductor regions;

said fifth semiconductor regions being disposed in said first direction and in said second direction;

a first group of plurality of interconnecting means insulated from each other and insulated from the first semiconductor regions, the second semiconductor regions, the third semiconductor regions and the fourth semiconductor regions and each interconnecting the fifth semiconductor regions disposed in the first direction;

a second group of plurality of interconnecting means insulated from each other, insulated from said first group of plurality of interconnection means and insulated from the second semiconductor regions, the third semiconductor region, the fourth semiconductor regions and the fifth semiconductor regions and each interconnecting said first semiconductor regions disposed in the second direction.

19. An optical sensor array according to claim 18, wherein;
said first semiconductor regions disposed in the second direction are in contact with each other in the second direction and interconnect themselves as one of said second group of plurality of interconnecting means instead of said one of said second group of plurality of interconnecting means.

20. An optical sensor array according to claim 18, further comprising:
one pair or plurality pairs of semiconductor regions;
said one pair or plurality pairs of semiconductor regions comprising;
sixth to nth semiconductor region(s) of the opposite conductivity type disposed apart from each of said second and said fourth semiconductor region and in contact with each said first semiconductor region, and seventh to (n+1)th semiconductor region(s) of the first conductivity type in contact with each said sixth to said nth semiconductor region and;
said "n" denoting an even integer number beginning from six and number of said pair being one when n equals 6, two when n equals eight, three when n equals ten and four when n equals twelve and so on;

said third semiconductor region being interconnected instead of said fourth region to said sixth semiconductor region;

said fourth semiconductor region being interconnected instead of said third semiconductor region to said (n+1)th semiconductor region;

an odd numbered semiconductor region of a pair of said plurality pairs of semiconductor regions except said (n+1)th semiconductor region being each interconnected to an even numbered semiconductor region of another pair of said plurality pairs of semiconductor regions.

21. An optical sensor array according to claim 20, wherein;
said first semiconductor regions disposed in the second direction are in contact with each other in the second direction and interconnect themselves as one of said second group of plurality of interconnecting means instead of said one of said second group of plurality of interconnecting means.

22. An optical sensor array according to claim 3, wherein energy band gap of said third semiconductor region is larger than that of said second semiconductor region.

23. An optical sensor array according to claim 18, wherein energy band gap of said third semiconductor region is larger than that of said second semiconductor region.

24. An optical sensor array according to claim 3, wherein energy band gap of said second semiconductor region is larger than that of said first semiconductor region.

25. An optical sensor array according to claim 18, wherein energy band gap of said second semiconductor region is larger than that of said first semiconductor region.

26. An optical sensor array according to claim 3, wherein said first semiconductor region is made of a semiconductor material with energy band gap smaller than 1.1 electron volt.

27. An optical sensor array according to claim 18, wherein said first semiconductor region is made of a semiconductor material with energy band gap smaller than 1.1 electron volt.

28. An optical sensor array according to claim 3, wherein said first semiconductor region is made of $In_xGa_yAs_zP_qSb_r$ grown on a semi-insulating semiconductor substrate, where said x, y, z, q and r are real numbers from 0 to 1.

29. An optical sensor array according to claim 18, wherein said first semiconductor region is made of $In_xGa_yAs_zP_qSb_r$ grown on a semi-insulating semiconductor substrate, where said x, y, z, q and r are real numbers from 0 to 1.

30. An optical sensor array according to claim 3, wherein said first semiconductor region is made of compound semiconductor and the third semiconductor region is made of $In_xGa_yAs_zP_qSb_r$, where said x, y, z, q and r are real numbers from 0 to 1.

31. An optical sensor array according to claim 30, wherein thickness of the third semiconductor region is larger than three times of inverse of optical absorption coefficient of a light to be sensed.

32. An optical sensor array according to claim 3, wherein;
said first semiconductor regions are disposed in contact with a surface of a substrate and separated by a twenty first region each other.

33. An optical sensor array according to claim 18, wherein;
said first semiconductor regions are disposed in contact with a surface of a substrate and separated by a twenty first region each other.

34. An optical sensor array according to claim 3, wherein;
a twenty second region is disposed between two of said second semiconductor regions.

35. An optical sensor array according to claim 18, wherein;
a twenty second region is disposed between two of said second semiconductor regions.

36. An optical sensor array according to claim 5, wherein;
said first semiconductor region has a first opposed surface opposed to the first surface and a conductive layer is attached to the first semiconductor region on said first opposed surface.

37. An optical sensor array according to claim 19, wherein;
said first semiconductor region has a first opposed surface opposed to the first surface and a conductive layer is attached to the first semiconductor region on said first opposed surface.

38. An optical sensor array according to claim 3, wherein;
one out of said first group of plurality of interconnecting means and said second group of plurality of interconnecting means are conductive thin films.

39. An optical sensor array according to claim 18, wherein;
one out of said first group of plurality of interconnecting means and said second group of plurality of interconnecting means are conductive thin films.

40. An optical sensor array according to claim 3, wherein;
one out of said first group of plurality of interconnecting means and said second group of plurality of interconnecting means are metal wires.

41. An optical sensor array according to claim 18, wherein;
one out of said first group of plurality of interconnecting means and said second group of plurality of interconnecting means are metal wires.

42. An optical sensor array comprising:
a semi-insulating semiconductor substrate;
first semiconductor regions of a first conductivity type grown on said substrate;
said first semiconductor regions are disposed spaced apart each other in a first direction;
second semiconductor regions of an opposite conductivity type epitaxially grown on said first semiconductor regions and being disposed in said first direction and in a second direction,
said first direction and said second direction intersecting each other;
third semiconductor regions each epitaxially grown on each of said second semiconductor regions and being disposed in the first and second direction;
a first interconnecting means interconnecting said third semiconductor regions in the first direction.

43. An optical sensor array according to claim 42, wherein;
said substrate is made of semi-insulating InP;
said first semiconductor region is made of InP;
said third semiconductor region is made of $In_xGa_yAs_zSb_r$, where x, y, z and r is a real number from 0 to 1.

44. An optical sensor array device, comprising:
an optical sensor array;
periphery circuitry comprising a first driving means, a second driving means and a current sensing means;
said optical sensor array comprising optical sensors, a first group of plurality of interconnecting means, a second group of plurality of interconnecting means;
each one of said optical sensors being connected to one of said first group of plurality of interconnecting means and to one of said second group of plurality of interconnecting means;
an optical sensor being selected from said optical sensors at a cross-point of selected one of said first group of plurality of interconnecting means and selected one of said second group of plurality of interconnecting means, wherein the following sensing method is applied;
one group of plurality of interconnecting means being selected out of said first group of plurality of interconnecting means and said second group of plurality of interconnecting means, and one out of selected group of plurality of interconnecting means being further selected out of said selected group of plurality of interconnecting means;
said first driving means driving the selected one interconnecting means from a first electrical potential to a second electrical potential while rest of said selected group of plurality of interconnecting means are kept to said first electrical potential and then turning to of a high impedance output state;
said current sensing means is sequentially sensing at around said second electrical potential photo-electrical current from optical sensors connected to said selected one of said selected group of plurality of interconnecting means through said selected one of said selected group of plurality of interconnecting means;
for the sequential sensing, said second driving means sequentially driving each one of unselected group of plurality of interconnecting means from a third electrical potential to a fourth electrical potential and then from said fourth electrical potential to said third electrical potential while rest of said unselected group of plurality of interconnecting means are kept to said third electrical potential;
said fourth electrical potential supplied to said optical sensor through said one of said unselected group of plurality of interconnecting means and said second electrical potential supplied to said selected optical sensor through said selected one of said selected group of plurality of interconnecting means making said photo-electrical current from said selected optical sensor available;
said third electrical potential supplied to said optical sensor through said one of said unselected group of plurality of interconnecting means and said first electrical potential supplied to said selected optical sensor through said selected one of said selected group of plurality of interconnecting means making the photo-electrical current from said selected optical sensor unavailable except a leakage current.

45. An optical sensor array device according to claim 44,
further comprising an analog to digital converter, a memory block and a correction circuit,
wherein;
first, using said sequential sensing, each reference electrical information from each optical sensor in the optical sensor array under a reference illumination is sensed;
said each reference electrical information sensed is converted to each reference digital data by said analog to digital converter and memorized in said memory block;
then, using said sequential sensing, each electrical information from each optical sensor in the optical sensor array under a target optical image is sensed;
the each electrical information sensed is converted to each digital data by said analog to digital converter and divided in said correction circuit by each reference digital data stored in the memory block;
said correction circuit outputs the each digital data divided by each reference digital data.

46. An optical sensor array device according to claim 45, wherein;
number of said reference illumination is plural and said plurality of reference illumination have each illumination level and plural sets of reference digital data are memorized in said memory block;

said each digital data from each optical sensor is divided by a reference digital data from said each optical sensor with reference level nearest to said each digital data from said each optical sensor;

said divided data are further multiplied by said illumination level.

47. An optical sensor array device according to claim 44, further comprising a memory block and a correction circuit, wherein;

using said sequential sensing, each "dark" electrical information from each optical sensor in the optical sensor array in a "dark" environment is sensed;

the each "dark" electrical information sensed is converted to each "dark" digital data by the analog to digital converter and memorized in said memory block;

then, using said sequential sensing, each electrical information from each optical sensor in the optical sensor array under a target optical image is sensed;

the each electrical information sensed is converted to each digital data by the analog to digital converter and subtracted in the correction circuit each "dark" digital data stored in the memory block;

said correction circuit outputs the each digital data subtracted by each "dark" digital data.

48. An optical sensor array device according to claim 45, wherein;

memory element of said memory block is non-volatile memory.

49. An optical sensor array device according to claim 47, wherein;

memory element of said memory block is non-volatile memory.

50. An optical sensor array device, comprising:

an optical sensor array;

periphery circuitry comprising first driving means and a second driving means; a current sensing means; a dummy current sensing means and differential amplifier;

said optical sensor array comprising:

optical sensors;

a first group of plurality of interconnecting means;

at least one dummy interconnecting means to which dummy optical sensors are connected;

second group of plurality of interconnecting means;

each one of said optical sensors being connected to one of said first group of plurality of interconnecting means and to one of said second group of plurality of interconnecting means;

an optical sensor of said optical sensor array being selected by a cross-point of selected one of said first group of plurality of interconnecting means and selected one of said second group of plurality of interconnecting means, wherein;

one group of plurality of interconnecting means being selected out of said first group of plurality of interconnecting means and said second group of plurality of interconnection means;

and one interconnecting means being further selected out of said selected group of plurality of interconnecting means and being driven by the first driving means from a first electrical potential to a second electrical potential while rest of said selected group of plurality of interconnecting means are kept to said first electrical potential and then said first driving means being made of a high impedance output state; said dummy interconnecting means being disposed parallel to said selected group of plurality of interconnecting means and at the same time being driven by the first driving means from a first electrical potential to a second electrical potential and said first driving means being made of a high impedance output state, wherein;

photo-electrical current from optical sensors connected to said selected one of said selected group of plurality of interconnecting means is sequentially sensed by said current sensing means at around said second electrical potential through said selected one of said selected group of plurality of interconnecting means and dummy current from dummy optical sensors connected to said dummy interconnecting means is sequentially sensed by said dummy current sensing means at around said second electrical potential through said dummy interconnecting means, by sequentially driving by said second driving means unselected group of plurality of interconnecting means from a third electrical potential to a fourth electrical potential and then from said fourth electrical potential to said third electrical potential while rest of said unselected group of plurality of interconnecting means are kept to said third electrical potential;

said fourth electrical potential supplied to said optical sensor through said one of said unselected group of plurality of interconnecting means and said second electrical potential supplied to said selected optical sensor through said selected one of said selected group of plurality of interconnecting means making said photo-electrical current from said selected optical sensor available;

said third electrical potential supplied to said optical sensor through said one of said unselected group of plurality of interconnecting means and said first electrical potential supplied to said selected optical sensor through said selected one of said selected group of plurality of interconnecting means making the photo-electrical current from said selected optical sensor unavailable except a leakage current;

wherein;

compensated electrical information of each optical sensor is obtained from an output of the differential amplifier to one of whose inputs an electrical information from said current sensing means is supplied and to the other one of whose inputs an electrical signal from said dummy current sensing means is supplied.

51. A first driving means for the optical sensor array device of claim 44, comprising:

a first group of field effect transistors to one of each source and drain of which said first electrical potential is supplied and the other one of each source and drain of which is connected to each of said selected group of plurality of interconnecting means;

a second group of field effect transistors to one of each source and drain of which said second electrical potential is supplied and the other one of each source and drain of which is connected to each of said selected group of plurality of interconnecting means;

a third group of field effect transistors one of each source and drain of which is connected to an inverting input of said current sensing means and the other one of each source and drain of which is connected to each of said selected group of plurality of interconnecting means, wherein;

selection of one of the selected group of plurality of interconnecting means is made by making a selected one of the first group of field effect transistors from "on" to "off", while the other (non-selected) first group of field effect transistors are "on";

and said one of the second group field effect transistors which is connected to said selected one of the selected group of plurality of interconnecting means is made from "off" to "on", while the other second group field effect transistors are "off";

then, one of the third group field effect transistors which is connected to said selected one of the selected group of plurality of interconnecting means is made from "off" to "on", while the other third group field effect transistors are "off";

and said one of the second group field effect transistors which is connected to said selected one of the selected group of plurality of interconnecting means is made from "on" to "off";

after that, sensing of the photo-electrical current from optical sensors connected to the selected one of the selected group of plurality of interconnecting means starts by sequentially driving each one of unselected group of plurality of interconnecting means from a third electrical potential to a fourth electrical potential and then from said fourth electrical potential to said third electrical potential while rest of said unselected group of plurality of interconnecting means are kept to said third electrical potential.

52. A first driving means for the optical sensor array device of claim 50, comprising:

a first group of field effect transistors to one of each source and drain of which said first electrical potential is supplied and the other one of each source and drain of which is connected to each of said selected group of plurality of interconnecting means;

a second group of field effect transistors to one of each source and drain of which said second electrical potential is supplied and the other one of each source and drain of which is connected to each of said selected group of plurality of interconnecting means;

a third group of field effect transistors one of each source and drain of which is connected to an inverting input of said current sensing means and the other one of each source and drain of which is connected to each of said selected group of plurality of interconnecting means, wherein;

selection of one of the selected group of plurality of interconnecting means is made by making a selected one of the first group of field effect transistors from "on" to "off", while the other (non-selected) first group of field effect transistors are "on";

and one of the second group field effect transistors which is connected to said selected one of the selected group of plurality of interconnecting means is made from "off" to "on", while the other second group field effect transistors are "off";

then, one of the third group field effect transistors which is connected to said selected one of the selected group of plurality of interconnecting means is made from "off" to "on", while the other third group field effect transistors are "off";

and said one of the second group field effect transistors which is connected to said selected one of the selected group of plurality of interconnecting means is made from "on" to "off" "off";

after that, sensing of the photo-electrical current from optical sensors connected to the selected one of the selected group of plurality of interconnecting means starts by sequentially driving each one of unselected group of plurality of interconnecting means from a third electrical potential to a fourth electrical potential and then from said fourth electrical potential to said third electrical potential while rest of said unselected group of plurality of interconnecting means are kept to said third electrical potential.

53. A first driving means according to claim 51, comprising;

instead of the second group field effect transistors, a fourth field effect transistor to one of source and drain of which said second electrical potential is supplied and the other one of source and drain of which is connected to the inverting input of the current sensing means, wherein;

selection of one of the selected group of plurality of interconnecting means is made by making a selected one of the first group of field effect transistors from "on" to "off", while the other (non-selected) first group of field effect transistors are "on";

then, the forth transistors is made from "off" to "on";

and one of the third group field effect transistors which is connected to said selected one of the selected group of plurality of interconnecting means is made from "off" to "on", while the other third group field effect transistors are "off";

after making the forth transistor "off", sensing of the photo-electrical current from optical sensors connected to the selected one of the selected group of plurality of interconnecting means starts by sequentially driving each one of unselected group of plurality of interconnecting means from a third electrical potential to a fourth electrical potential and then from said fourth electrical potential to said third electrical potential while rest of said unselected group of plurality of interconnecting means are kept to said third electrical potential.

54. A first driving means according to claim 52, comprising;

instead of the second group field effect transistors, a fourth field effect transistor to one of source and drain of which said second electrical potential is supplied and the other one of source and drain of which is connected to the inverting input of the current sensing means, wherein;

selection of one of the selected group of plurality of interconnecting means is made by making a selected one of the first group of field effect transistors from "on" to "off", while the other (non-selected) first group of field effect transistors are "on";

then, the forth transistors is made from "off" to "on";

and one of the third group field effect transistors which is connected to said selected one of the selected group of plurality of interconnecting means is made from "off" to "on", while the other third group field effect transistors are "off";

after making the forth transistor "off", sensing of the photo-electrical current from optical sensors connected to the selected one of the selected group of plurality of interconnecting means starts by sequentially driving each one of unselected group of plurality of interconnecting means from a third electrical potential to a fourth electrical potential and then from said fourth electrical potential to said third electrical potential while rest of said unselected group of plurality of interconnecting means are kept to said third electrical potential.

55. An apparatus for optical imaging comprising:
an optical sensor array device according to claim 44;
an optical imaging means for focusing an optical image of an object on said optical sensor array device.

56. An apparatus for optical imaging comprising:
   an optical sensor array device according to claim 45;
   an optical imaging means focusing an optical image of an object on said optical sensor array device.
57. An apparatus for optical imaging comprising:
   an optical sensor array device according to claim 47;
   an optical imaging means for focusing an optical image of an object on said optical sensor array device.
58. An apparatus for optical imaging comprising:
   an optical sensor array device according to claim 50;
   an optical imaging means for focusing an optical image of an object on said optical sensor array device.
59. An apparatus for optical imaging according to claim 55, further comprising:
   a display means displaying an image according to an output from said current sensing means.
60. An apparatus for optical imaging according to claim 56, further comprising:
   a display means displaying an image according to the data from said correction circuit.
61. An apparatus for optical imaging according to claim 57, further comprising:
   a display means displaying an image according to the data from said correction circuit.
62. An apparatus for optical imaging according to claim 58, further comprising:
   a display means displaying an image according to the data from said differential circuit.
63. A sensing method of an optical sensor array comprising:
   optical sensors, a first group of plurality of interconnecting means and second group of plurality of interconnecting means;
   each one of said optical sensors being connected to one of said first group of plurality of interconnecting means and to one of said second group of plurality of interconnecting means;
   an optical sensor being selected from said optical sensors at a cross-point of said first group of plurality of interconnecting means and said second group of plurality of interconnecting means, wherein;
   one group of plurality of interconnecting means are selected out of said first group of plurality of interconnecting means and second group of plurality of interconnection means, and one of said selected group of plurality of interconnecting means is further selected and is driven from a first electrical potential to a second electrical potential while rest of said selected group of plurality of interconnecting means are kept to said first electrical potential, and
   photo-electrical current from optical sensors connected to said selected one of said selected group of plurality of interconnecting means is sequentially sensed at around said second electrical potential through said selected one of said selected group of plurality of interconnecting means,
   by sequentially driving each one of unselected group of plurality of interconnecting means from a third electrical potential to a fourth electrical potential and then from said fourth electrical potential to said third electrical potential while rest of said unselected group of plurality of interconnecting means are kept to said third electrical potential;
   said fourth electrical potential supplied to said optical sensor through said one of said unselected group of plurality of interconnecting means and said second electrical potential supplied to said selected optical sensor through said selected one of said selected group of plurality of interconnecting means making said photo-electrical current from said selected optical sensor available;
   said third electrical potential supplied to said optical sensor through said one of said unselected group of plurality of interconnecting means and said first electrical potential supplied to said selected optical sensor through said selected one of said selected group of plurality of interconnecting means making the photo-electrical current from said selected optical sensor unavailable except a leakage current.
64. A sensing method of an optical sensor array according to claim 63, wherein;
   said one of said selected group of plurality of interconnecting means is driven by a first driving means from said first electrical potential to said second electrical potential and from said second electrical potential to said first electrical potential while rest of said selected group of plurality of interconnecting means is kept to said first electrical potential;
   said first driving means is of electrically high impedance during photo-electrical current from said selected optical sensors is sensed, after driving said one of said selected group of plurality of interconnecting means from said first electrical potential to said second electrical potential.
65. A sensing method of an optical sensor array according to claim 64, wherein;
   said current sensing means having a non-inverting input and an inverting input;
   said non-inverting input being connected to said second electrical potential and said inverting input being switched to said selected one of the selected group of the plurality of interconnecting means and photo-electrical current from the selected optical sensor being sensed during said first driving means is of electrically high impedance.
66. A sensing method of an optical sensor array according to claim 65, wherein;
   said current sensing means is switched with a delay time to said one of the selected group of the plurality of interconnecting means and starts to sense photo-electrical current from the selected optical sensor, after a voltage transient from said first electrical potential to said second electrical potential on said one of selected group of interconnecting means.
67. An optical sensor array according to claim 3, wherein;
   said fourth electrical potential with reference to said second electrical potential being of a polarity forward-biasing the second semiconductor region to the third semiconductor region; and
   said third electrical potential with reference to said first electrical potential being of a polarity reverse-biasing or zero-biasing the third semiconductor region to the second semiconductor region.
68. An optical sensor array according to claim 3, wherein;
   said fourth electrical potential with reference to said second electrical potential being of a polarity forward-biasing the second semiconductor region to the first semiconductor region;
   and said third electrical potential with reference to said first electrical potential being of a polarity reverse-biasing or zero-biasing the first semiconductor region to the second semiconductor region.
69. An optical sensor array according to claim 32, wherein;
   said substrate is made of semiconductor of the opposite conductivity.

70. An optical sensor array according to claim 33, wherein; said substrate is made of semiconductor of the opposite conductivity.

71. An optical sensor array according to claim 32, wherein; said twenty first region is made of semiconductor of the opposite conductivity.

72. An optical sensor array according to claim 33, wherein; said twenty first region is made of semiconductor of the opposite conductivity.

73. An optical sensor array according to claim 34, wherein; said twenty second region is made of semiconductor of the opposite conductivity.

74. An optical sensor array according to claim 35, wherein; said twenty second region is made of semiconductor of the opposite conductivity.

75. An optical sensor array according to claim 32, wherein; said substrate is made of semi-insulating semiconductor.

76. An optical sensor array according to claim 33, wherein; said substrate is made of semi-insulating semiconductor.

77. An optical sensor array according to claim 32, wherein; said twenty first region is made of semi-insulating semiconductor.

78. An optical sensor array according to claim 33, wherein; said twenty first region is made of semi-insulating semiconductor.

79. An optical sensor array according to claim 34, wherein; said twenty second region is made of semi-insulating semiconductor.

80. An optical sensor array according to claim 35, wherein; said twenty second region is made of semi-insulating semiconductor.

81. An optical sensor array according to claim 32, wherein; said substrate is made of insulating material.

82. An optical sensor array according to claim 33, wherein; said substrate is made of insulating material.

83. An optical sensor array according to claim 32, wherein; said twenty first region is made of insulating material.

84. An optical sensor array according to claim 33, wherein; said twenty first region is made of insulating material.

85. An optical sensor array according to claim 34, wherein; said twenty second region is made of insulating material.

86. An optical sensor array according to claim 35, wherein; said twenty second region is made of insulating material.

87. An optical sensor array according to claim 32, wherein; said twenty first region is an air-gap.

88. An optical sensor array according to claim 33, wherein; said twenty first region is an air-gap.

89. An optical sensor array according to claim 34, wherein; said twenty second region is an air-gap.

90. An optical sensor array according to claim 35, wherein; said twenty second region is an air-gap.

* * * * *